United States Patent
Cho et al.

(10) Patent No.: US 9,883,593 B2
(45) Date of Patent: Jan. 30, 2018

(54) SEMICONDUCTOR MODULES AND SEMICONDUCTOR PACKAGES

(71) Applicants: KyongSoon Cho, Incheon (KR); Yungcheol Kong, Cheonan-si (KR)

(72) Inventors: KyongSoon Cho, Incheon (KR); Yungcheol Kong, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 60 days.

(21) Appl. No.: 14/714,531

(22) Filed: May 18, 2015

(65) Prior Publication Data

US 2016/0044790 A1 Feb. 11, 2016

(30) Foreign Application Priority Data

Aug. 5, 2014 (KR) .................. 10-2014-0100634

(51) Int. Cl.
*H05K 1/00* (2006.01)
*H05K 1/18* (2006.01)
(Continued)

(52) U.S. Cl.
CPC ............. *H05K 1/189* (2013.01); *H01L 23/13* (2013.01); *H01L 23/49816* (2013.01); *H01L 24/97* (2013.01); *H01L 25/0657* (2013.01); *H01L 25/105* (2013.01); *H01L 25/165* (2013.01); *H05K 1/028* (2013.01); *H01L 21/561* (2013.01); *H01L 23/3128* (2013.01); *H01L 23/49811* (2013.01); *H01L 23/49822* (2013.01); *H01L 23/562* (2013.01); *H01L 24/06* (2013.01); *H01L 24/16* (2013.01); *H01L 24/17* (2013.01); *H01L 24/32* (2013.01); *H01L 24/73* (2013.01);
(Continued)

(58) Field of Classification Search
CPC ....... H05K 2201/10416; H05K 1/0298; H05K 1/189; H05K 3/326; H05K 1/118; H05K 1/147; H05K 1/0281; H01L 23/13
See application file for complete search history.

(56) References Cited

U.S. PATENT DOCUMENTS 6,580,169 B2  6/2003  Sakuyama et al.
6,750,549 B1 *  6/2004  Chandran ............... H01L 23/13
                                                                257/778
(Continued)

FOREIGN PATENT DOCUMENTS

JP    H11-067960 A   3/1999
JP    2003-188508 A  7/2003
(Continued)

*Primary Examiner* — Steven T Sawyer
(74) *Attorney, Agent, or Firm* — Harness, Dickey & Pierce, P.L.C.

(57) ABSTRACT

Provided are semiconductor modules and semiconductor packages. The semiconductor module may include a module substrate and a semiconductor package mounted on the module substrate. The semiconductor package may include a substrate with a top surface and a bottom surface. Here, the top surface of the substrate may be flat and the bottom surface of the substrate may include a first region and a second region positioned at a lower level than the first region. The semiconductor package may further include connecting portions which are provided on the bottom surface of the substrate and electrically connected to the module substrate.

12 Claims, 23 Drawing Sheets

(51) Int. Cl.

| | | |
|---|---|---|
| *H01L 25/16* | (2006.01) | |
| *H01L 25/065* | (2006.01) | |
| *H01L 25/10* | (2006.01) | |
| *H05K 1/02* | (2006.01) | |
| *H01L 23/13* | (2006.01) | |
| *H01L 23/498* | (2006.01) | |
| *H01L 23/31* | (2006.01) | |
| *H01L 21/56* | (2006.01) | |
| *H01L 23/00* | (2006.01) | |
| *H01L 25/00* | (2006.01) | |
| *H05K 3/46* | (2006.01) | |

(52) U.S. Cl.
CPC .............. *H01L 24/92* (2013.01); *H01L 25/50* (2013.01); *H01L 2224/0401* (2013.01); *H01L 2224/06181* (2013.01); *H01L 2224/16227* (2013.01); *H01L 2224/1703* (2013.01); *H01L 2224/17181* (2013.01); *H01L 2224/32225* (2013.01); *H01L 2224/73204* (2013.01); *H01L 2224/92125* (2013.01); *H01L 2224/97* (2013.01); *H01L 2225/06517* (2013.01); *H01L 2225/06572* (2013.01); *H01L 2225/1023* (2013.01); *H01L 2225/1058* (2013.01); *H01L 2924/14* (2013.01); *H01L 2924/1431* (2013.01); *H01L 2924/1434* (2013.01); *H01L 2924/15153* (2013.01); *H01L 2924/15159* (2013.01); *H01L 2924/15311* (2013.01); *H01L 2924/15331* (2013.01); *H01L 2924/19106* (2013.01); *H01L 2924/3511* (2013.01); *H05K 1/181* (2013.01); *H05K 3/4697* (2013.01); *H05K 2201/09845* (2013.01); *H05K 2201/1053* (2013.01); *H05K 2201/10515* (2013.01); *H05K 2201/10522* (2013.01); *H05K 2201/10734* (2013.01); *H05K 2201/10977* (2013.01)

(56) References Cited

U.S. PATENT DOCUMENTS

| | | |
|---|---|---|
| 6,780,023 B2 | 8/2004 | Miyagawa |
| 6,835,960 B2 | 12/2004 | Lin et al. |
| 7,084,500 B2 | 8/2006 | Swnson et al. |
| 7,462,511 B2 | 12/2008 | Yamagata |
| 7,566,116 B2 | 7/2009 | Saito et al. |
| 7,768,125 B2 | 8/2010 | Chow et al. |
| 7,902,663 B2 | 3/2011 | Fan |
| 8,371,026 B2 | 2/2013 | Nomiya et al. |
| 2003/0114024 A1* | 6/2003 | Miyagawa ........... H05K 3/3436 439/68 |
| 2004/0194999 A1 | 10/2004 | Tomita et al. |
| 2005/0039945 A1* | 2/2005 | Matsuda ............. H01L 23/4985 174/254 |
| 2005/0093151 A1* | 5/2005 | Swanson ............. H01L 23/3114 257/738 |
| 2005/0095878 A1* | 5/2005 | Palanisamy ......... H01L 27/3288 439/61 |
| 2014/0138823 A1* | 5/2014 | Zhang .................... H01L 22/12 257/738 |

FOREIGN PATENT DOCUMENTS

| | | |
|---|---|---|
| JP | 2009-272359 A | 11/2009 |
| KR | 10-0267558 B1 | 10/2000 |
| KR | 10-2012-0018526 A | 3/2012 |
| KR | 10-2013-0101192 A | 9/2013 |

* cited by examiner

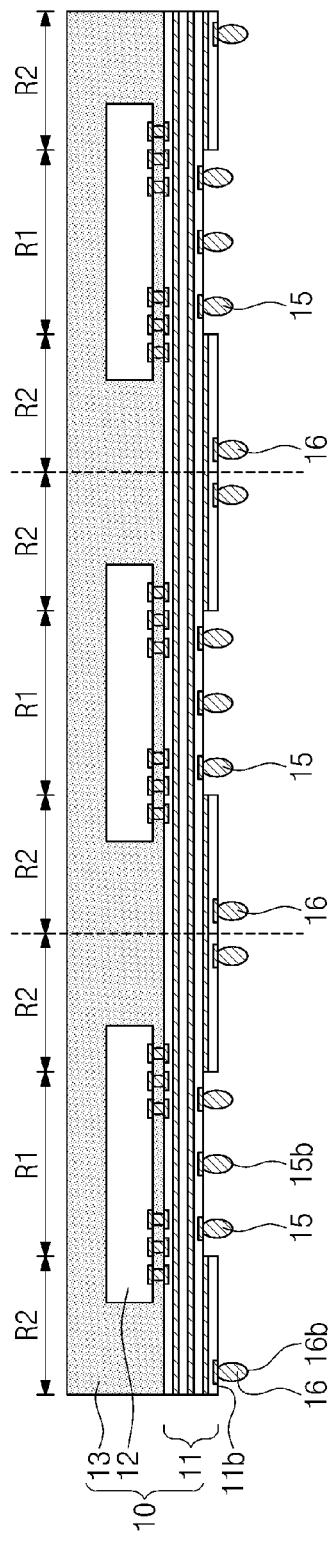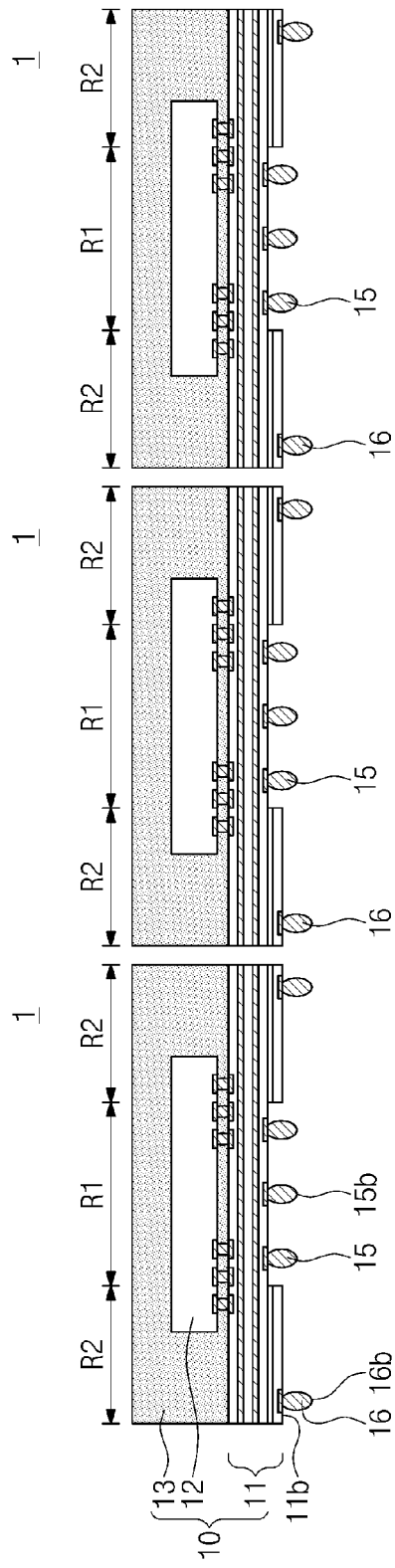

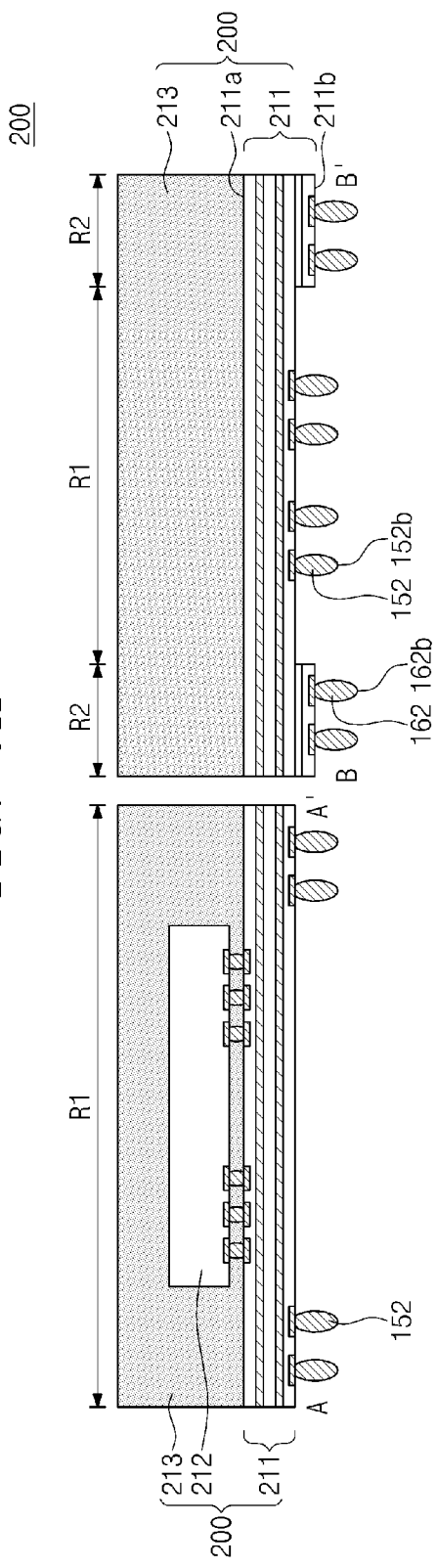
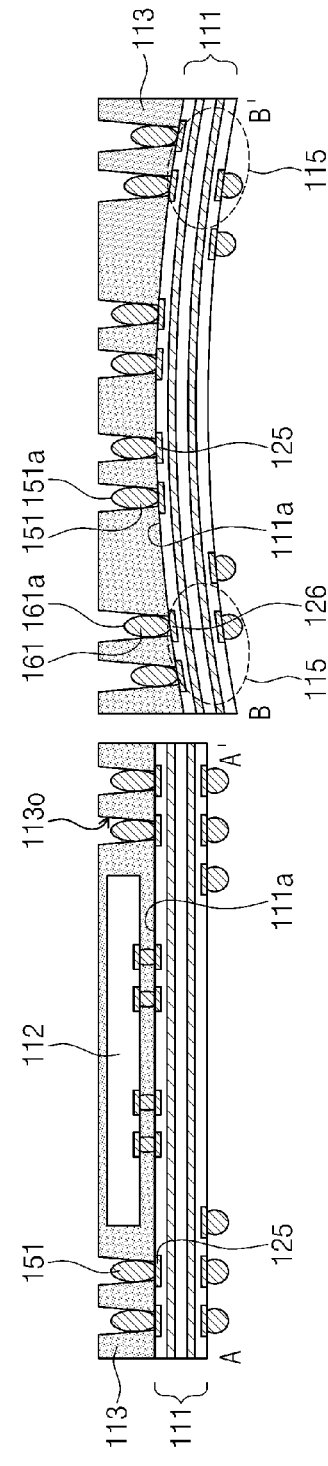
FIG. 7A
FIG. 7B

SEMICONDUCTOR MODULES AND SEMICONDUCTOR PACKAGES

CROSS-REFERENCE TO RELATED APPLICATIONS

This U.S. non-provisional patent application claims priority under 35 U.S.C. §119 to Korean Patent Application No. 10-2014-0100634, filed on Aug. 5, 2014, in the Korean Intellectual Property Office, the entire contents of which are hereby incorporated by reference.

BACKGROUND

Example embodiments of the inventive concepts relate to semiconductor devices, and in particular, to semiconductor modules and/or semiconductor packages.

Recently, demand for electronic products (e.g., cellular phones and notebook computers) with a light weight and a small size is increasing. To meet such demand, reducing a size and a weight of a semiconductor module in the electronic product is desired.

Further, as multimedia technology develops, demand for flexible electronic devices is increasing. Thus, mounting a device (e.g., an organic light emitting display (OLED) device, a liquid crystal display (LCD) device, a plasma display panel (PDP), a thin-film transistor (TFT), a microprocessor, and/or random access memory (RAM)) on a flexible substrate is desired.

SUMMARY

Some of example embodiments of the inventive concepts provide semiconductor packages and/or semiconductor modules that have a good mounting property.

Some of example embodiments of the inventive concepts provide highly-reliable semiconductor packages and/or highly-reliable semiconductor modules.

According to an example embodiment of the inventive concepts, a semiconductor module may include a module substrate, and a semiconductor package on the module substrate. The semiconductor package may include a substrate including a top surface and a bottom surface, the top surface being flat and the bottom surface including a first region and a second region at a lower level than the first region, a semiconductor chip on the top surface of the substrate, and connecting portions on the bottom surface of the substrate and electrically connected to the module substrate, the connecting portions including first connecting portions on the first region and second connecting portions on the second regions, and bottom surfaces of the second connecting portions being lower than bottom surfaces of the first connecting portions.

In some example embodiments, the second connecting portions may have a same height as the first connecting portions.

In some example embodiments, the module substrate may have a curved section.

In some example embodiments, the curved section may have a first curved portion protruding toward the semiconductor package and a second curved portion being farther from the semiconductor package than the first curved portion, and when viewed in a plan view, the second curved portion may overlap the second region of the substrate.

In some example embodiments, the semiconductor module may further include an electronic device between the module substrate and the semiconductor package.

In some example embodiments, when viewed in a plan view, the electronic device may overlap the first region of the substrate.

In example embodiments, the bottom surface of the substrate may further include a third region at a lower level than the first and second regions, the connecting portions further include third connecting portions in the third region, and the bottom surfaces of the third connecting portions may be lower than the bottom surfaces of the second connecting portions.

In some example embodiments, the substrate may be thicker at the second region than at the first region.

In some example embodiments, the semiconductor package may further include a mold layer covering the semiconductor chip.

According to an example embodiment of the inventive concepts, a semiconductor module may include a module substrate, and a semiconductor package on the module substrate. The semiconductor package may include a substrate with a top surface with a flat shape and a bottom surface with a protrusion protruding toward the module substrate, a semiconductor chip on the top surface of the substrate, a first connecting portion on the bottom surface of the substrate and laterally spaced apart from the protrusion, and a second connecting portion on the protrusion of the substrate.

In some example embodiments, the second connecting portion may have a same height as the first connecting portion.

In some example embodiments, the module substrate may have a curved section.

In some example embodiments, a core of the module substrate may have a shape bending toward the substrate and an edge of the module substrate has a shape bending away from the substrate, the first connecting portion may be in contact with a pad on the core, and the second connecting portion may be in contact with a pad on the edge.

In some example embodiments, a core of the module substrate may has a shape bending away from the substrate and an edge of the module substrate has a shape bending toward the substrate, the first connecting portion may be in contact with a pad on the edge, and the second connecting portion may be in contact with a pad on the core.

In some example embodiments, the semiconductor module may further include an electronic device between the module substrate and the semiconductor package.

In some example embodiments, when viewed in a plan view, the electronic device may be spaced apart from the protrusion of the substrate.

In some example embodiments, the first connecting portion may be in contact with the electronic device, and the second connecting portion may be in contact with the module substrate.

According to an example embodiment of the inventive concepts, a semiconductor package may include a lower package including a lower substrate and a lower semiconductor chip, an upper package including an upper substrate and an upper semiconductor chip, a protrusion on at least one of a top surface of the lower substrate and a bottom surface of the upper substrate, and connecting portions between the lower and upper substrates to electrically connect the upper package to the lower package. The connecting portions may include a first connecting portion spaced apart from the protrusion in a horizontal direction and a second connecting portion on the protrusion, the first and second connecting portions having the same height. At least one of the lower and upper substrates may include a curved portion.

In some example embodiments, the lower substrate includes the curved portion, the protrusion may extend from the bottom surface of the upper substrate toward the lower substrate.

In some example embodiments, the curved portion may have an upwardly convex shape, and when viewed in a plan view, the protrusion may overlap a portion of the curved portion that bends away from the upper substrate.

In some example embodiments, the curved portion corresponds to an edge of the lower substrate.

In some example embodiments, the curved portion may have a downwardly convex shape, and when viewed in a plan view, the protrusion may be spaced apart from a portion of the curved portion that bends toward the upper substrate.

In some example embodiments, the lower substrate may include the curved portion, and the protrusion extends from the top surface of the lower substrate toward the upper substrate.

In some example embodiments, the upper substrate may include the curved portion having a downwardly convex shape, the protrusion may be on the top surface of the lower substrate, and a top surface of the second connecting portion may be at a higher level than that of the first connecting portion.

In some example embodiments, the lower semiconductor chip may be mounted on the top surface of the lower substrate, the upper semiconductor chip may be mounted on a top surface of the upper substrate, and the first and second connecting portions may be spaced apart from the lower semiconductor chip in the horizontal direction.

According to an example embodiment of the inventive concepts, a semiconductor stack structure may include a lower substrate, an upper substrate on the lower substrate, at least one of the upper and lower substrates being a flexible substrate and including a curved shape, a protrusion on at least one of a top surface of the lower substrate and a bottom surface of the upper substrate, and connecting portions between the lower and upper substrates to provide electrical connection therebetween, the connecting portions including a first connecting portion spaced apart from the protrusion in a first direction, and a second connecting portion on the protrusion, the first and second connecting portions having a same height.

In some example embodiments, the upper substrate may include the curved shape, the lower substrate includes the protrusion on the top surface thereof.

In some example embodiments, the lower substrate may include the curved shape, the upper substrate includes the protrusion on the bottom surface thereof.

In some example embodiments, the curved shape of one of the upper and lower substrates may include a first region and a second region, the first region is configured to bend toward the other of the upper and lower substrates, and the second region is configured to bend away from the other of the upper and lower substrates, and the protrusion may be on the other of the upper and lower substrates and face at the second region of the curved shape of the one of the upper and lower substrates

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 2A through 2G are cross-sectional views illustrating a method of fabricating a semiconductor module according to an example embodiment of the inventive concepts.

FIGS. 7A through 7D are cross-sectional views illustrating a method of fabricating a semiconductor package according to an example embodiment of the inventive concepts.

Figure 1A:
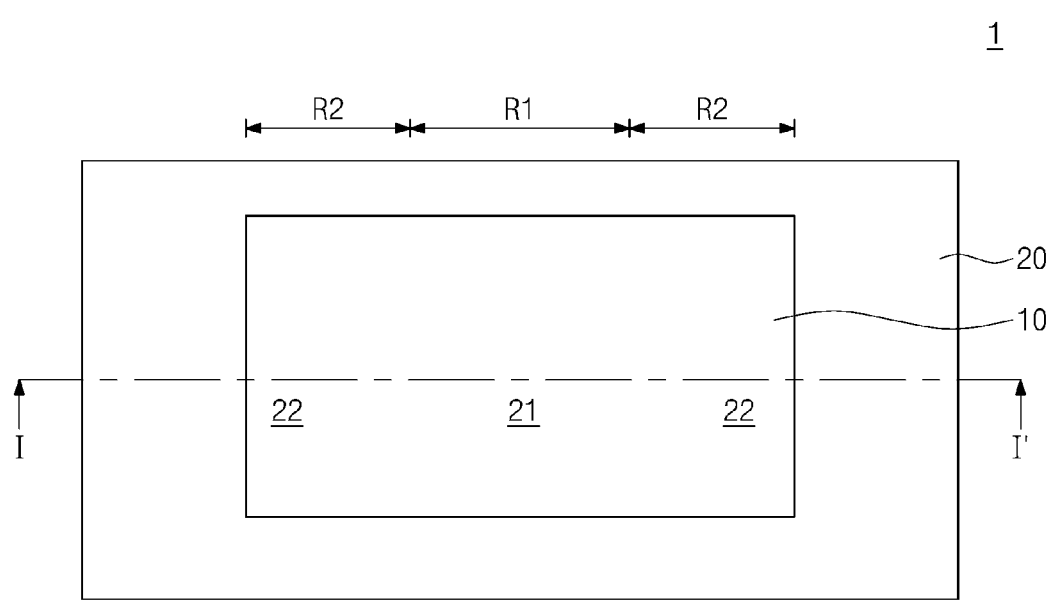
FIG. 1A is a plan view illustrating a semiconductor module according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which various example embodiments are shown. Example embodiments of the inventive concepts may, however, be embodied in many different forms and should not be construed as being limited to the example embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized example embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various example embodiments described herein may be embodied in microelectronic devices such as integrated circuits, wherein a plurality of devices according to various example embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various example embodiments described herein may include a plurality of the devices in an array and/or in a two-dimensional pattern that is based on the functionality of the microelectronic device.

The devices according to various example embodiments described herein may be interspersed among other devices depending on the functionality of the microelectronic device. Moreover, microelectronic devices according to various example embodiments described herein may be replicated in a third direction that may be orthogonal to the two different directions, to provide three-dimensional integrated circuits.

Accordingly, the cross-sectional view(s) illustrated herein provide support for a plurality of devices according to various example embodiments described herein that extend along two different directions in a plan view and/or in three different directions in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a semiconductor module including a curved module substrate will be described.

Figure 1B:
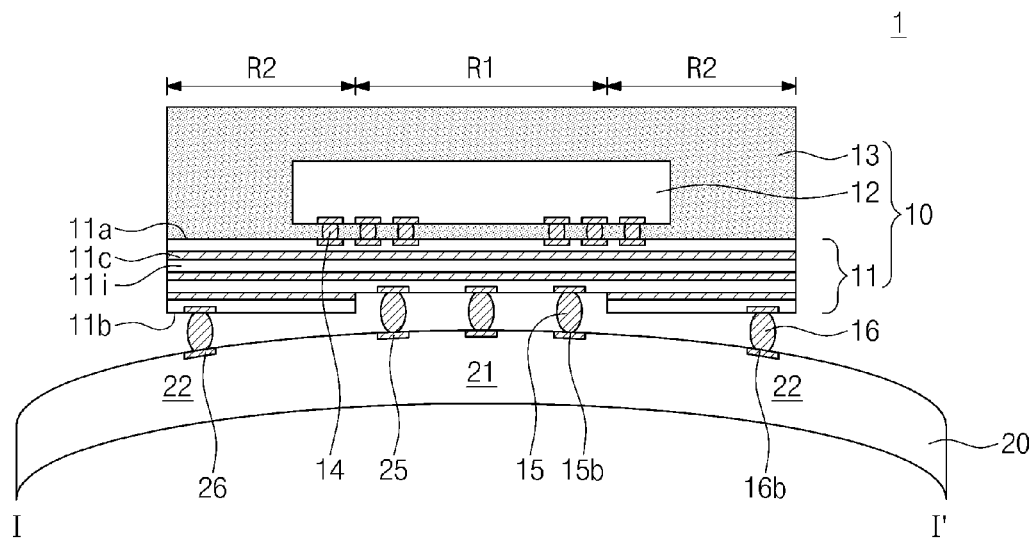
FIG. 1B is a sectional view taken along a line I-I' of FIG. 1A.

FIG. 1A is a plan view illustrating a semiconductor module according to an example embodiment of the inventive concepts. FIG. 1B is a cross-sectional view taken along a line I-I' of FIG. 1A.

Referring to FIGS. 1A and 1B, a semiconductor module 1 may include a module substrate 20 and a semiconductor package 10 mounted on the module substrate 20. The semiconductor package 10 may include a substrate 11, connecting portions 15 and 16, a semiconductor chip 12, and a mold layer 13.

The module substrate 20 may be flexible. For example, the module substrate 20 may be more flexible than the substrate 11 of the semiconductor package 10 of a same thickness. As an example, the module substrate 20 may include a plastic and/or a polymer, but example embodiments of the inventive concepts may not be limited thereto. The module substrate 20 may have a curved section. For example, the module substrate 20 may have an upwardly convex shape. The module substrate 20 may include a first curved portion 21, which bends toward the semiconductor package 10 and is located at a position corresponding to a core of the module substrate 20. The module substrate 20 may further include a second curved portion 22, which bend away from the semiconductor package 10 and is located at a position corresponding to an edge of the module substrate 20. For example, the second curved portion 22 may be farther from the semiconductor package 10 than the first curved portion 21. Pads 25 and 26 may be provided on a top surface of the module substrate 20. The pads 25 and 26 may include a conductive material and may be electrically connected to an electric circuit (not shown) in the module substrate 20.

The substrate 11 may be a printed circuit board (PCB) with circuit patterns. For example, the substrate 11 may include a plurality of insulating layers 11i and a conductive pattern 11c provided between the insulating layers 11i. The substrate 11 may have a top surface 11a with a flat shape and a bottom surface 11b with a staircase shape. For example, the bottom surface 11b of the substrate 11 may have first and second regions R1 and R2 positioned at different levels. In some example embodiments, the second region R2 of the bottom surface 11b may protrude downward from the first region R1 thereof, and thus, a level of the bottom surface 11b may be lower on the second region R2 than on the first region R1. A thickness of the substrate 11 may be thicker on the second region R2 than on the first region R1. When viewed in a plan view, the first region R1 may correspond to a core of the bottom surface 11b, and the second region R2 may correspond to an edge of the bottom surface 11b. As shown in FIG. 1A, the first region R1 may overlap the first curved portion 21 of the module substrate 20, and the second region R2 may overlap the second curved portion 22 of the module substrate 20.

Referring back to FIG. 1B, the connecting portions 15 and 16 may be provided on the bottom surface 11b of the substrate 11. The semiconductor package 10 may be electrically connected to the module substrate 20 via the connecting portions 15 and 16. The connecting portions 15 and 16 may include a conductive material and may be provided in the form of, for example, a solder ball or a bump. The connecting portions 15 and 16 may include a first connecting portion 15 on the first region R1 and a second connecting portion 16 on the second region R2. The second connecting portion 16 may have a volume and a height that are substantially equal or similar to those of the first connecting portion 15. In the present disclosure, the sameness in volume, size, or height means that a difference associated therewith is smaller than a tolerance limit of a fabrication process. Because the bottom surface 11b of the substrate 11 has a staircase shape, there may be a different in height between bottom surfaces 15b and 16b of the first and second connecting portions 15 and 16. For example, the bottom surface 16b of the second connecting portion 16 may be located at a different level from the bottom surface 15b of the first connecting portion 15. In the case where the bottom surfaces 15b and 16b are located at the same level, the first connecting portion 15 may be in contact with the first pad 25 on the first curved portion 21, but the second connecting portion 16 may not be in contact with the second pad 26 on the second curved portion 22. By contrast, in the present example embodiment, the bottom surface 16b of the second connecting portion 16 may be provided at a lower level than the bottom surface 15b of the first connecting portion 15. Accordingly, the first connecting portion 15 may be in contact with the first pad 25 provided on the first curved portion 21, and the second connecting portions 16 may be in contact with the second pad 26 provided on the second curved portion 22. As a result, the semiconductor package 10 can be reliably mounted on the module substrate 20 having the curved profile, and moreover, it is possible to realize the semiconductor module 1 with improved reliability.

The semiconductor chip 12 may be disposed on the top surface 11a of the substrate 11. The semiconductor chip 12 may include an integrated circuit (e.g., memory cells or logic circuits). Bumps 14 may be interposed between the substrate 11 and the semiconductor chip 12. The semiconductor chip 12 may be electrically connected to the substrate 11 via the bumps 14. The bumps 14 may include a conductive material.

Figure 1C:
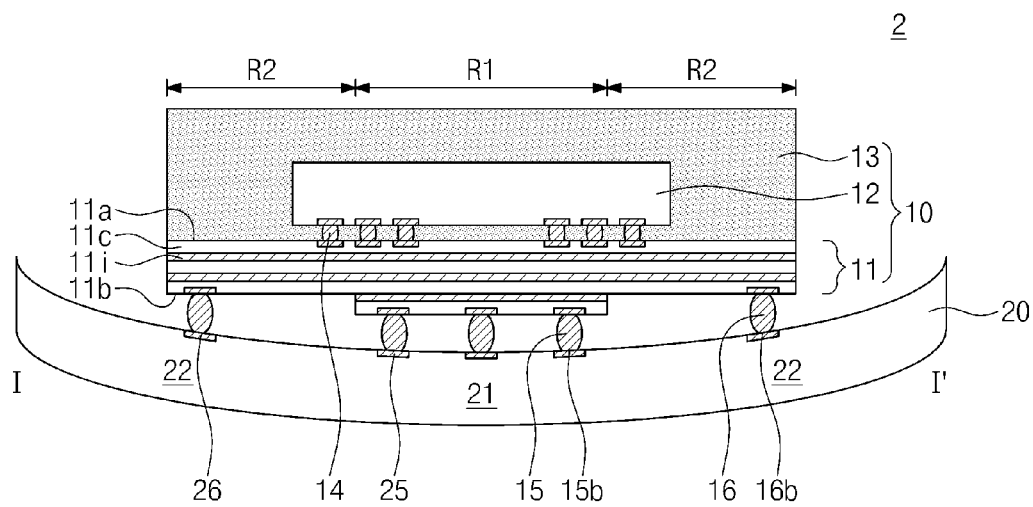
FIG. 1C is a cross-sectional view illustrating a semiconductor module according to another example embodiment of the inventive concepts.

The mold layer 13 may be provided on the top surface 11a of the substrate 11 to cover the semiconductor chip 12. The mold layer 13 may include an insulating polymer material (e.g., an epoxy molding compound (EMC)). The mold layer 13 may extend between the substrate 11 and the semiconductor chip 12 and fill gap regions between the bumps 14. In other example embodiments, an under-fill layer (not shown) may be provided between the substrate 11 and the semiconductor chip 12 to fill the gap regions between the bumps 14. FIG. 1C is a cross-sectional view illustrating a semiconductor module according to another example embodiment of the inventive concepts. For concise description, previously described elements may be identified by similar or identical reference numbers without repeating overlapping descriptions thereof.

Referring to FIGS. 1A and 1C, a semiconductor module 2 may include the module substrate 20 and the semiconductor package 10. The module substrate 20 may be flexible. The module substrate 20 may have a curved section (e.g., a downwardly convex shape). The first curved portion 21 may correspond to the core of the module substrate 20 and may bend away from the semiconductor package 10. The second curved portion 22 may correspond to the edge of the module substrate 20 and may bend toward the semiconductor package 10. The second curved portion 22 may be closer to the substrate 11 than the first curved portion 21.

The substrate 11 may be a printed circuit board (PCB). For example, the substrate 11 may include a plurality of the insulating layers 11i and the conductive pattern 11c. The substrate 11 may have the top surface 11a with a flat shape and the bottom surface 11b with a staircase shape. In some example embodiments, a level of the bottom surface 11b may be lower on the first region R1 than on the second region R2. The first region R1 may have a shape protruding from the second region R2. A thickness of the substrate 11 may be larger at the first region R1 than at the second region R2. The first region R1 may correspond to the core of the bottom surface 11b, and the second region R2 may correspond to the edge of the bottom surface 11b.

The first and second connecting portions 15 and 16 may be provided on the first and second regions R1 and R2, respectively. The second connecting portion 16 may have substantially the same volume as the first connecting portion 15. Because the bottom surface 11b of the substrate 11 has a staircase shape, there may be a difference in height between the bottom surfaces 15b and 16b of the connecting portions 15 and 16. For example, the bottom surface 15b of the first connecting portion 15 may be positioned at a lower level than the bottom surface 16b of the second connecting portion 16. In the case where the bottom surface 15b of the first connecting portion 15 is positioned at the same level as the bottom surface 16b of the second connecting portion 16, the second connecting portion 16 may be in contact with the second pad 26 provided on the second curved portion 22, but the first connecting portion 15 may not be in contact with the first pad 25 provided on the first curved portion 21. According to this example embodiment, the first connecting portion 15 may be in contact with the first pad 25 disposed on the first curved portion 21, and the second connecting portion 16 may be in contact with the second pad 26 disposed on the second curved portion 22. Accordingly, the semiconductor package 10 can be reliably mounted on the module substrate 20 with the curved section, and moreover, it is possible to realize the semiconductor module 2 with improved reliability.

The semiconductor chip 12 may be disposed on the top surface 11a of the substrate 11. The bumps 14 may be interposed between the substrate 11 and the semiconductor chip 12. The mold layer 13 may be provided on the top surface 11a of the substrate 11 to cover the semiconductor chip 12.

Figure 1D:
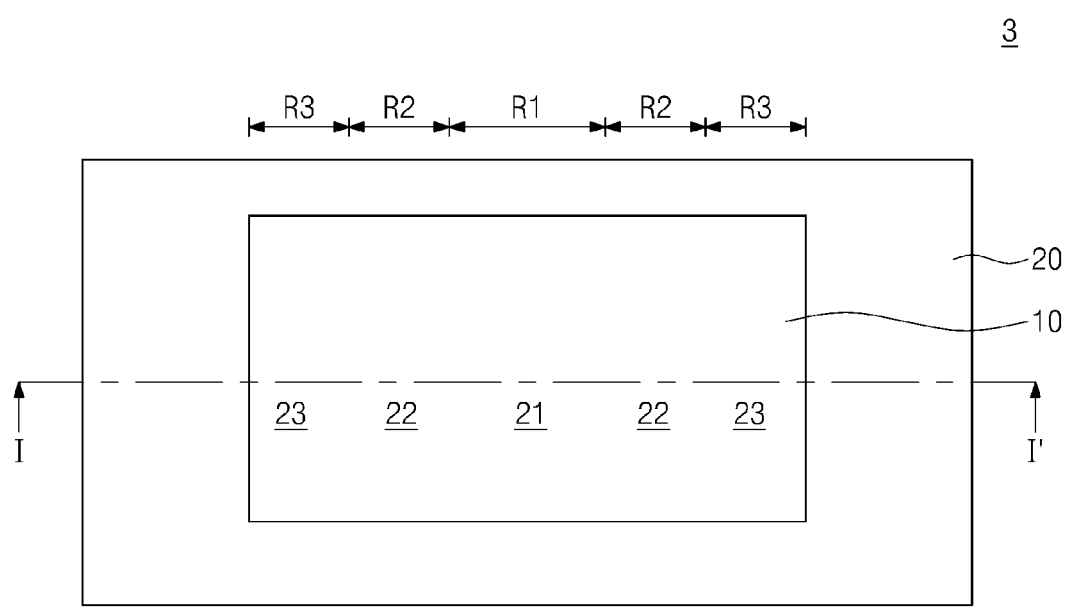
FIG. 1D is a plan view illustrating a semiconductor module according to still another example embodiment of the inventive concepts.
Figure 1E:
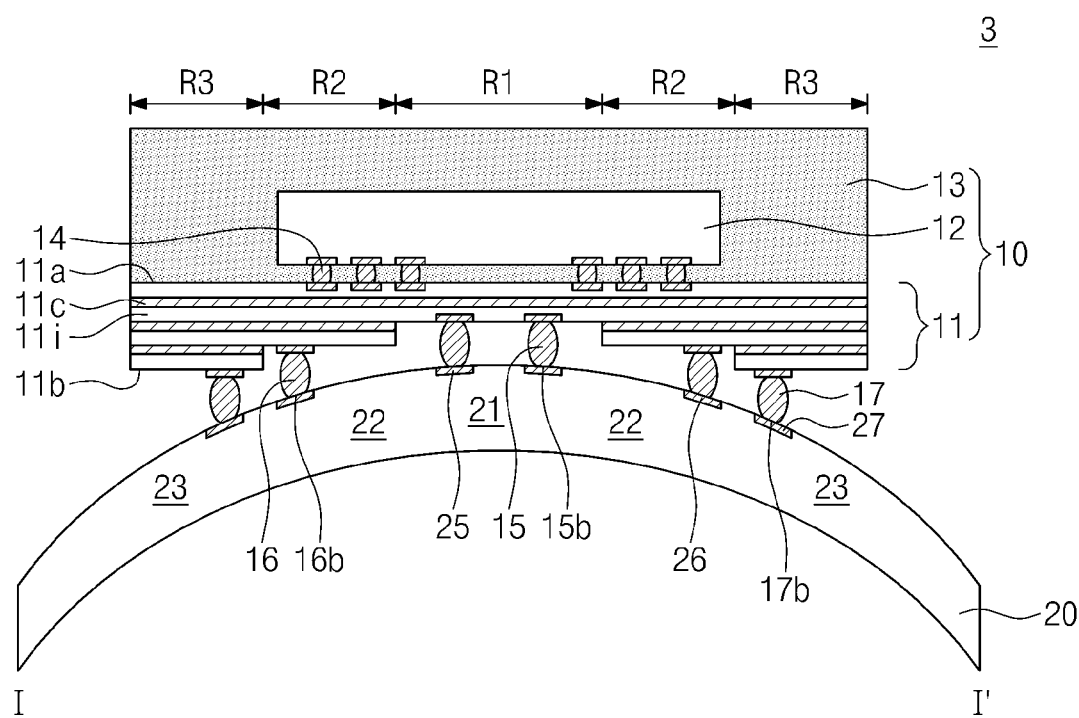
FIG. 1E is a cross-sectional view taken along a line I-I' of FIG. 1D.

FIG. 1D is a plan view illustrating a semiconductor module according to still another example embodiment of the inventive concepts, and FIG. 1E is a cross-sectional view taken along a line I-I' of FIG. 1D. For concise description, previously described elements may be identified by similar or identical reference numbers without repeating overlapping descriptions thereof.

Referring to FIGS. 1D and 1E, a semiconductor module 3 may include the module substrate 20 and the semiconductor package 10. The module substrate 20 may be flexible. The module substrate 20 may have a curved section. For example, the module substrate 20 may have an upwardly convex shape. The module substrate 20 may be more severely curved than those of the previous example embodiments. For example, the module substrate 20 may have a curvature radius smaller than that of FIGS. 1A and 1B. The first curved portion 21 may correspond to the core of the module substrate 20 and may bend toward the semiconductor package 10. A third curved portion 23 may correspond to the edge of the module substrate 20 and may bend away from the semiconductor package 10. The second curved portion 22 may be disposed between the first curved portion 21 and the third curved portion 23.

The substrate 11 may be a printed circuit board (PCB). For example, the substrate 11 may include a plurality of the insulating layers 11i and the conductive pattern 11c. The substrate 11 may have the top surface 11a with a flat shape and the bottom surface 11b with a staircase shape. The bottom surface 11b may be provided to include a plurality of staircase-shaped portions. For example, the bottom surface 11b may include first to third regions R1, R2, and R3. The level of the bottom surface 11b may be lower on the second region R2 than on the first region R1 and may be lower on the third region R3 than on the second region R2. The substrate 11 may be thicker on the second region R2 than on the first region R1 and may be thicker on the third region R3 than on the second region R2. The first region R1 may correspond to the core of the bottom surface 11b, and the third region R3 may correspond to the edge of the bottom surface 11b. The second region R2 may be disposed between the first and third regions R1 and R3. As shown in FIG. 1D, when viewed in a plan view, the first, second, and third regions R1, R2, and R3 may overlap the first, second, and third curved portions 21, 22, and 3 of the module substrate 20, respectively.

First to third connecting portions 15, 16, and 17 may be respectively disposed on the first to third regions R1, R2, and R3 of the bottom surface 11b of the substrate 11. The first to third connecting portions 15, 16, and 17 may have the same volume and height, but example embodiments of the inventive concepts may not be limited thereto. Because the bottom surface 11b of the substrate 11 has the staircase shape, there may be a difference in height between bottom surfaces 15b, 16b, and 17b of the first to third connecting portions 15, 16, and 17. Due to the height differences between the bottom surfaces 15b, 16b, and 17b, the bottom surface 11b of the substrate 11 may have a staircase shape. For example, the bottom surface 16b of the second connecting portion 16 may be positioned at a lower level than the bottom surface 15b of the first connecting portion 15, and the bottom surface 17b of the third connecting portion 17 may be positioned at a lower level than the bottom surface 16b of the second connecting portion 16. The first to third connecting portions 15, 16, and 17 may be in contact with pads 25, 26, and 27 disposed on the first to third curved portions 21, 22, and 23, respectively. Accordingly, the semiconductor package 10 can be reliably mounted on the module substrate 20 with the curved section, and moreover, it is possible to realize the semiconductor module 3 with improved reliability. Further, according to the present example embodiment, the bottom surface 11b of the substrate 11 may include the first to third regions R1, R2, and R3, and the first to third connecting portions 15, 16, and 17 may be provided to have the bottom surfaces 15b, 16b, and 17b positioned at different levels. Accordingly, although the module substrate 20 has a relatively small curvature radius, the semiconductor package 10 can be reliably mounted on the module substrate 20.

The module substrate 20 may have the upwardly or downwardly convex section, but example embodiments of the inventive concepts may not be limited thereto. However, by adjusting the number, shapes, and/or heights of staircase portions that are formed on the bottom surface 11b of the substrate 11, it is possible to control levels of the bottom surfaces 15b, 16b, and 17b of the connecting portions 15, 16, and 17. For example, the connecting portions 15, 16, and 17 can be controlled in such a way that the bottom surfaces 15b, 16b, and 17b are reliably coupled to respective desired positions on such a curved top surface of the module substrate 20. Accordingly, the semiconductor package 10 can be reliably mounted on the module substrate 20, even if the module substrate 20 is formed to have a variety of curvatures. Hereinafter, a method of fabricating a semiconductor module according to an example embodiments of the inventive concepts will be described.

FIGS. 2A through 2G are cross-sectional views illustrating a method of fabricating a semiconductor module according to an example embodiment of the inventive concepts. For concise description, previously described elements may be identified by similar or identical reference numbers without repeating overlapping descriptions thereof.

Figure 2A:
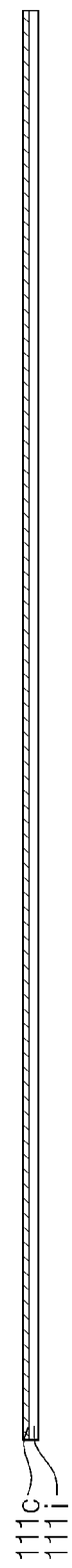

Referring to FIG. 2A, a first insulating layer 111i and a first conductive pattern 111c attached to each other may be provided. The first conductive pattern 111c and the first insulating layer 111i may have the same or similar configuration as the conductive pattern 11c and the insulating layer 11i, respectively, of the previous example embodiments described with reference to FIGS. 1A and 1B. The first conductive pattern 111c may include a metal (e.g., copper). The first insulating layer 111i may include, for example, at least one of silicon, silicon oxide, silicon nitride, and/or silicon oxynitride. Vias (not shown) may be provided in an insulating layer and may be electrically connected to the first conductive pattern 111c. In certain example embodiments, a plurality of the first conductive pattern 111c and/or a plurality of the first insulating layer 111i may be alternately stacked one on top of the other. The number and height of the first conductive patterns 111c and the number and height of the first insulating layers 111i may be adjusted in various manners.

Figure 2B:
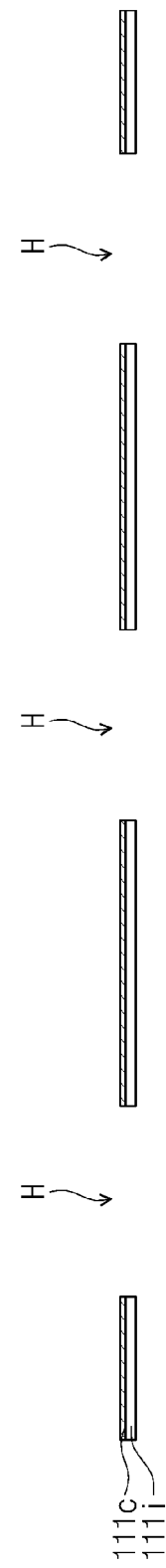

Referring to FIG. 2B, a hole H may be formed to penetrate the first conductive pattern 111c and the first insulating layer 111i. In certain example embodiments, the hole H may be formed using, for example, a mechanical method. For example, a punching process may be performed on the first conductive pattern 111c and the first insulating layer 111i.

Figure 2C:
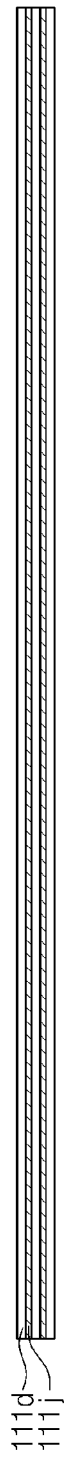

Referring to FIG. 2C, second conductive patterns 111d and second insulating layers 111j may be provided. The second conductive pattern 111d and the second insulating layer 111j may be provided. The second conductive pattern 111d and the second insulating layer 111j may have substantially the same or similar configuration as the conductive pattern 11c and the insulating layer 11i described with reference to FIGS. 1A and 1B. The second conductive patterns 111d and the second insulating layers 111j may be alternately stacked one on top of the other. The number of the second conductive patterns 111d and/or the number of the second insulating layers 111j may be one or more, but the number and height thereof may be adjusted in various manners.

Figure 2D:
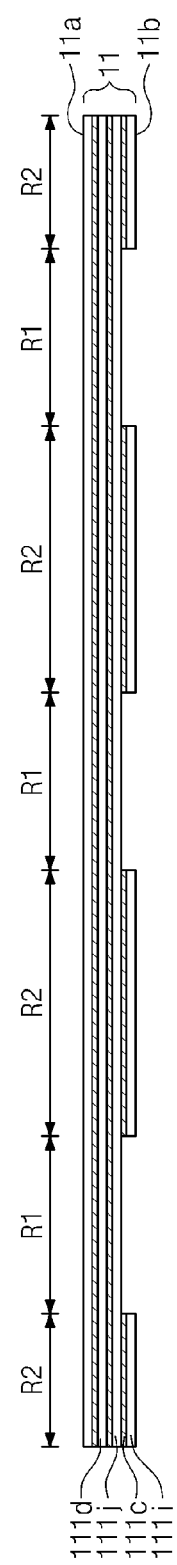

Referring to FIG. 2D, the first conductive pattern 111c and the first insulating layer 111i may be attached to the second conductive patterns 111d and second insulating layers 111j to form the substrate 11. The first conductive pattern 111c and the first insulating layer 111i may be adjacent to the bottom surface 11b of the substrate 11. The first conductive pattern 111c and the first insulating layer 111i may be protruded from one of the second conductive patterns 111d and the second insulating layers 111j. Accordingly, the top surface 11a of the substrate 11 may have a flat shape, whereas the bottom surface 11b of the substrate 11 may have a staircase shape. For example, the second region R2 of the bottom surface 11b may be positioned at a lower level than the first region R1 of the bottom surface 11b. Here, the first conductive pattern 111c and the first insulating layer 111i may be provided on the second region R2. The first conductive pattern 111c may be interposed between the first and second insulating layers 111i and 111j. The second conductive patterns 111d may be interposed between the second insulating layers 111j.

Referring to FIG. 2E, the connecting portions 15 and 16 may be attached to the bottom surface 11b of the substrate 11. For example, the first connecting portions 15 may be disposed on the first region R1 of the substrate 11, and the second connecting portion 16 may be disposed on the second region R2 of the substrate 11. The first and second connecting portions 15 and 16 may be of the same type. For example, the first connecting portion 15 may have the same volume and/or height as the second connecting portion 16 and include the same material as the second connecting portion 16. Accordingly, the connecting portions 15 and 16 may be formed to have a difference in height between the bottom surfaces 15b and 16b thereof. The difference in height between the bottom surfaces 15b and 16b may be defined between the first and second regions R1 and R2 of the bottom surface 11b of the substrate 11. For example, the bottom surface 16b of the second connecting portion 16 may be positioned at a lower level than the bottom surface 15b of the first connecting portion 15. In some example embodiments, the connecting portions 15 and 16 may be formed to have the same size, and this makes it possible to reliably fabricate the semiconductor package 10. Alternatively, the first and second connecting portions 15 and 16 may be formed to have a difference in size thereof. Even in this case, the bottom surface 15b of the first connecting portion 15 may be provided at a lower level than the bottom surface 16b of the second connecting portion 16.

The semiconductor chip 12 may be disposed on the first region R1 of the top surface 11a of the substrate 11. As shown in FIG. 2E, a plurality of the semiconductor chips 12 may be mounted spaced apart from each other on the substrate 11. For example, the semiconductor chip 12 may be electrically connected to the substrate 11 via the bumps 14. In certain example embodiments, the semiconductor chip 12 may be mounted on and electrically connected to the substrate 11 by a wire bonding (not shown). The mold layer 13 may be provided on the top surface 11a of the substrate 11 to cover the semiconductor chip 12. An order of forming the connecting portions 15 and 16, the semiconductor chip 12, and the mold layer 13 may be variously changed.

Referring to FIG. 2F, a sawing process may be performed on the substrate 11, and thus, the semiconductor package 10 may be formed. The semiconductor package 10 may may include the substrate 11, the semiconductor chip 12, the mold layer 13, and the connecting portions 15 and 16.

Figure 2G:
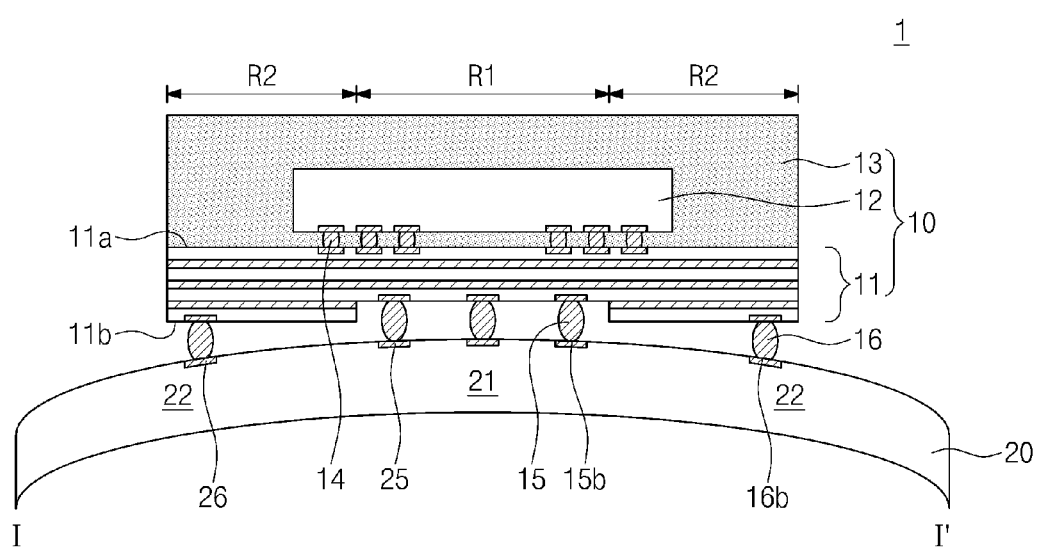

Referring to FIG. 2G along with FIG. 1A, the semiconductor package 10 may be mounted on the module substrate 20. The module substrate 20 may have a curved section. The module substrate 20 may have substantially the same configuration as that of the previous example embodiments described with reference to FIGS. 1A through 1D. In this example embodiment, the bottom surface 16b of the second connecting portion 16 may be positioned at a lower level as the bottom surface 15b of the first connecting portion 15. Accordingly, the first connecting portion 15 may be electrically connected to the first pad 25, which is provided on the first curved portion 21 of the module substrate 20, and the second connecting portion 16 of the substrate 11 may be electrically connected to the second pad 26, which is provided on the second curved portion 22. The formation of the connecting portions 15 and 16 may be variously changed in such a way that a difference in level between the bottom surfaces 15b and 16b corresponds to the curved shape of the module substrate 20. The semiconductor module 1 may be fabricated by the afore-described method.

A semiconductor module according to even another example embodiment of the inventive concepts will be described below.

Figure 3A:
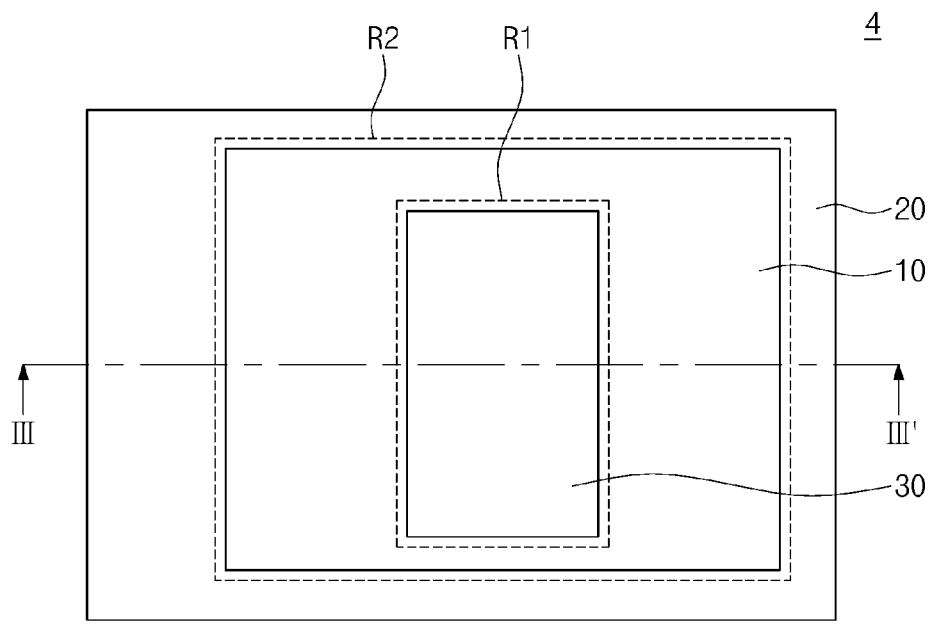
FIG. 3A is a plan view illustrating a semiconductor module according to even another example embodiment of the inventive concepts.
Figure 3B:
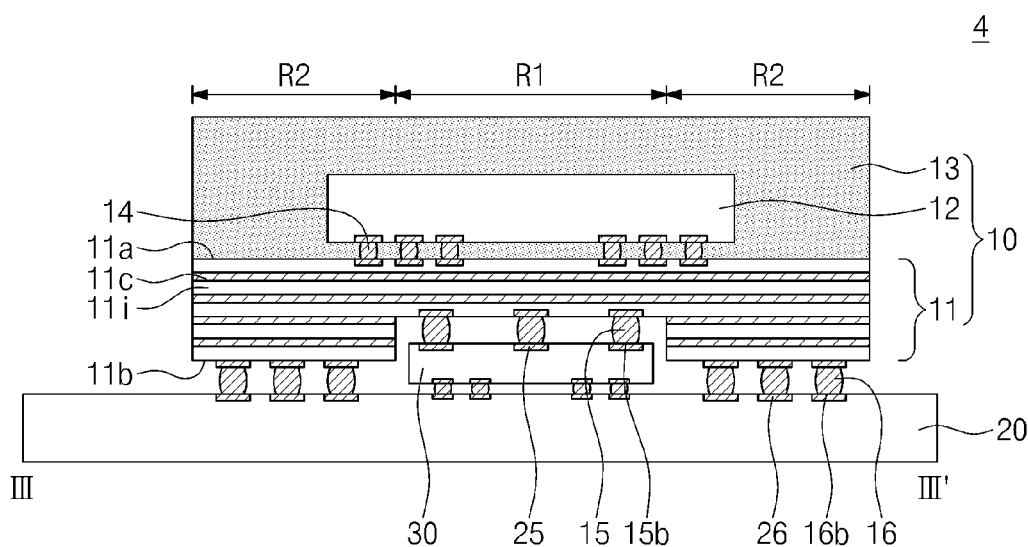
FIG. 3B is a sectional view taken along a line III-III' of FIG. 3A.

FIG. 3A is a plan view illustrating a semiconductor module according to even another example embodiment of the inventive concepts, and FIG. 3B is a cross-sectional view taken along a line III-III' of FIG. 3A. For concise description, previously described elements may be identified by similar or identical reference numbers without repeating overlapping descriptions thereof.

Referring to FIGS. 3A and 3B, a semiconductor module 4 may include the module substrate 20, an electronic device 30, and the semiconductor package 10.

The module substrate 20 may be a printed circuit board (PCB) with circuit patterns. The module substrate 20 may be flat. Alternatively, the module substrate 20 may be curved. The module substrate 20 may include an internal circuit (not shown). The electronic device 30 may be mounted on the top surface of the module substrate 20. The electronic device 30 may be, for example, a passive or active device. The electronic device 30 may be provided between the module substrate 20 and the semiconductor package 10.

The semiconductor package 10 may be provided on the top surface of the module substrate 20 and a top surface of the electronic device 30. The semiconductor package 10 may include the substrate 11, the semiconductor chip 12, the mold layer 13, and the connecting portions 15 and 16. The top surface 11a of the substrate 11 may have a flat shape, and the bottom surface 11b may have a staircase shape. For example, a level of the bottom surface 11b may be lower on the second region R2 than on the first region R1. For example, the second region R2 may protrude downward from the first region R1, and a thickness of the substrate 11 may be thicker on the second region R2 than on the first region R1. The first region R1 may correspond to a core of the bottom surface 11b, and the second region R2 may correspond to an edge of the bottom surface 11b. When viewed in a plan view, as shown in FIG. 3A, the first region R1 may overlap the electronic device 30, whereas the second region R2 may not overlap the electronic device 30.

The connecting portions 15 and 16 may be provided on the bottom surface 11b of the substrate 11. The semiconductor package 10 may be electrically connected to the module substrate 20 via the connecting portions 15 and 16. The second connecting portion 16 may have the same volume and height as the first connecting portion 15. Since the second region R2 of the bottom surface 11b is positioned at a lower level than the first region R1 of the bottom surface 11b, the bottom surface 16b of the second connecting portion 16 may be positioned at a lower level than the bottom surface 15b of the first connecting portion 15. A height difference of the bottom surface 11b of the substrate 11 may correspond to a height difference between the bottom surfaces 15b and 16b of the connecting portions 15 and 16.

The electronic device 30 may be provided between the module substrate 20 and the semiconductor package 10. In the case where the bottom surface 15b of the first connecting portion 15 is positioned at the same level as the bottom surface 16b of the second connecting portion 16, planar disposition of the semiconductor package 10 may be limited by the electronic device 30. For example, the semiconductor package 10 may be mounted on the module substrate 20 and may be laterally spaced apart from the electronic device 30. In the present example embodiments, because the bottom surface 11b of the substrate 11 has a height difference, the semiconductor package 10 can be tightly coupled to the module substrate 20, while overlapping the electronic device 30 as shown in FIG. 3A, when viewed in a plan view. For example, the first connecting portion 15 may be in contact with the first pad 25 disposed on the top surface of the electronic device 30, and the second connecting portion 16 may be in contact with the second pad 26 disposed on the top surface of the module substrate 20. For example, the first connecting portion 15 may be omitted. Accordingly, disposition of the semiconductor package 10 may not be limited by the presence of the electronic device 30. When viewed in a plan view, the semiconductor package 10 may overlap the electronic device 30, and this makes it possible to reduce a size of the semiconductor module 4.

Figure 4A:
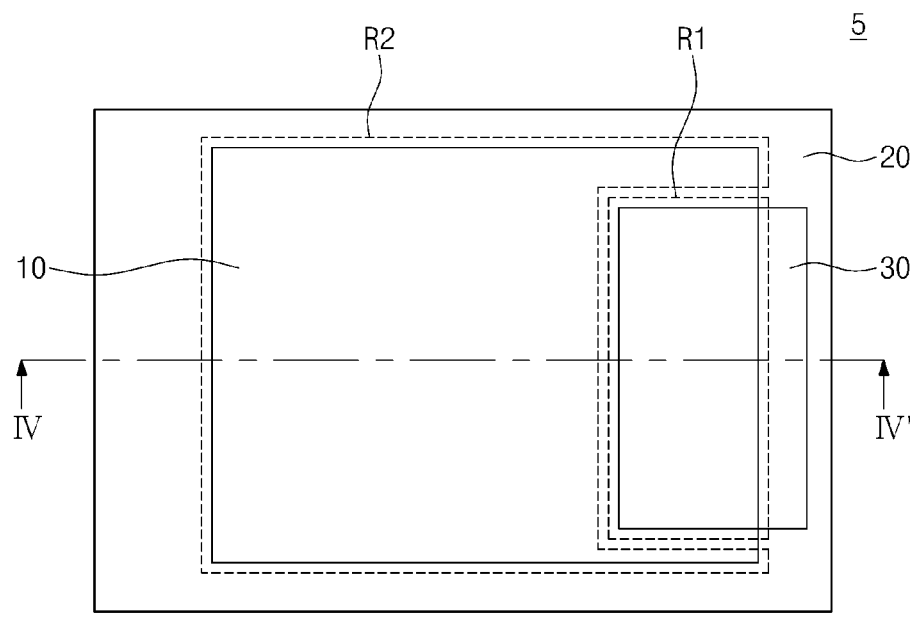
FIG. 4A is a plan view illustrating a semiconductor module according to yet another example embodiment of the inventive concepts.
Figure 4B:
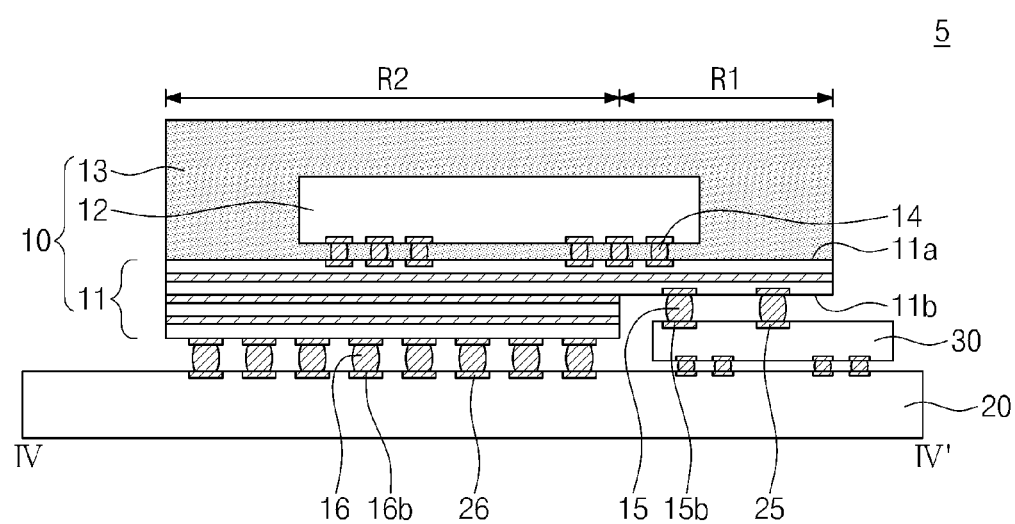
FIG. 4B is a sectional view taken along a line IV-IV' of FIG. 4A.

FIG. 4A is a plan view illustrating a semiconductor module according to yet another example embodiment of the inventive concepts, and FIG. 4B is a sectional view taken along a line IV-IV' of FIG. 4A. For concise description, previously described elements may be identified by similar or identical reference numbers without repeating overlapping descriptions thereof.

Referring to FIGS. 4A and 4B, a semiconductor module 5 may include the module substrate 20, the electronic device 30, and the semiconductor package 10. The electronic device 30 may be mounted on the top surface of the module substrate 20. The electronic device 30 may be disposed between the module substrate 20 and the semiconductor package 10.

The semiconductor package 10 may be disposed on the top surface of the module substrate 20 and electronic device 30. The semiconductor package 10 may include the substrate 11, the semiconductor chip 12, the mold layer 13, and the connecting portions 15 and 16. The top surface 11a of the substrate 11 may have a flat shape, and the bottom surface 11b may have a staircase shape. For example, a level of the bottom surface 11b may be lower on the second region R2 than on the first region R1. As shown in FIG. 4A, when viewed in a plan view, the first region R1 may overlap the electronic device 30, and the second region R2 may be spaced apart from the electronic device 30. The first region R1 may correspond to an edge portion of the bottom surface 11b, and the second region R2 may correspond to another edge portion of the bottom surface 11b.

The connecting portions 15 and 16 may be provided on the bottom surface 11b of the substrate 11. The second connecting portion 16 may have a volume and a height that are substantially equal or similar to those of the first connecting portion 15. Because the second region R2 of the bottom surface 11b is positioned at a lower level than the first region R1 of the bottom surface 11b, the second connecting portion 16 may be provided at a lower level than the first connecting portion 15. A height difference of the bottom surface 11b of the substrate 11 may be substantially equal to a difference in height between the bottom surfaces 15b and 16b of the connecting portions 15 and 16. The first connecting portion 15 may be in contact with the first pad 25 disposed on the top surface of the electronic device 30, and the second connecting portion 16 may be in contact with the second pad 26 disposed on the top surface of the module substrate 20. For example, the first connecting portion 15 may be omitted. Because the bottom surface 11b of the substrate 11 has the staircase shape, disposition of the semiconductor package 10 may not be limited by the presence of the electronic device 30. This makes it possible to reduce a size of the semiconductor module 5.

Figure 5A:
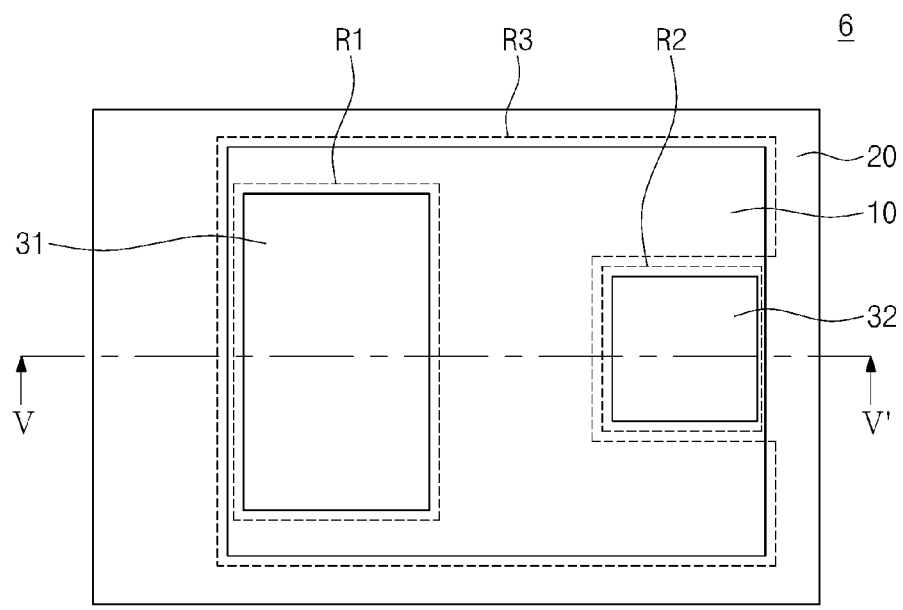
FIG. 5A is a plan view illustrating a semiconductor module according to further another example embodiment of the inventive concepts.
Figure 5B:
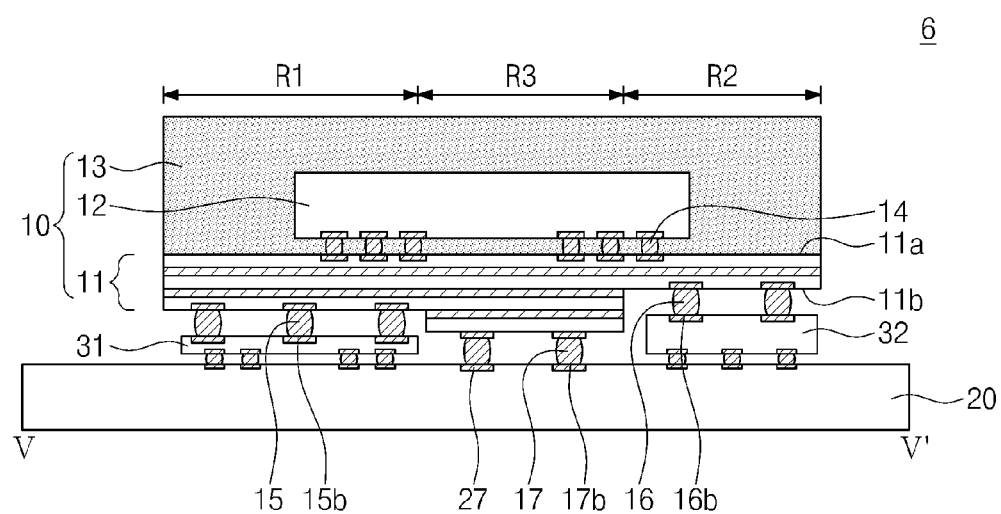
FIG. 5B is a sectional view taken along a line V-V' of FIG. 5A.

FIG. 5A is a plan view illustrating a semiconductor module according to further another example embodiment of the inventive concepts, and FIG. 5B is a sectional view taken along a line V-V' of FIG. 5A. For concise description, previously described elements may be identified by similar or identical reference numbers without repeating overlapping descriptions thereof.

Referring to FIGS. 5A and 5B, a semiconductor module 6 may include the module substrate 20, a first electronic device 31, a second electronic device 32, and the semiconductor package 10. The module substrate 20 may be a printed circuit board (PCB). The first electronic device 31 and the second electronic device 32 may be mounted on the top surface of the module substrate 20. Each of the first and second electronic devices 31 and 32 may be, for example, one of passive and active devices. The first and second electronic devices 31 and 32 may be disposed between the module substrate 20 and the semiconductor package 10.

The semiconductor package 10 may be disposed on the top surface of the module substrate 20. The semiconductor package 1 may include the substrate 11, the semiconductor chip 12, the mold layer 13, and the connecting portions 15 and 16. The top surface 11a of the substrate 11 may be flat. The bottom surface 11b may be provided to include a plurality of staircase-shaped portions. The bottom surface 11b may include first to third regions R1, R2, and R3. As shown in FIG. 5A, when viewed in a plan view, the first and second regions R1 and R2 may overlap the first and second electronic devices 31 and 32, respectively. The third region R3 may not overlap the first and second electronic devices 31 and 32. The first region R1 may be adjacent to one side of the bottom surface 11b, the third region R3 may be adjacent to the other side of the bottom surface 11b, and the second region R2 may be provided between the first and third regions R1 and R3. However, disposition of the first to third regions R1, R2, and R3 may not be limited thereto and may be variously modified depending of a position of the electronic devices 31 and 32.

Referring back to FIG. 5B, the third region R3 of the bottom surface 11b may be positioned at a different level from the first and second regions R1 and R2 of the bottom surface 11b. For example, compared with the first and third regions R1 and R3 of the bottom surface 11b, the second region R2 of the bottom surface 11b may have a shape protruding toward the module substrate 20, and thus, be positioned at a lower level than those of the first and third regions R1 and R3 of the bottom surface 11b. A thickness of the substrate 11 may be thicker on the third region R3 than on the first and second regions R1 and R2. The second region R2 of the bottom surface 11b may be positioned at a level that is equal to or different from that of the first region R1.

The first to third connecting portions 15, 16, and 17 may be disposed on the first to third regions R1, R2, and R3 of the bottom surface 11b of the substrate 11, respectively. The first to third connecting portions 15, 16, and 17 may have substantially the same volume and substantially the same height. For example, the first connecting portion 15 and/or the second connecting portion 16 may be omitted. Because the level of the bottom surface 11b is lower on the third region R3 than on the first and second regions R1 and R2, the bottom surface 17b of the third connecting portion 17 may be positioned at a lower level than the bottom surface 15b of the first connecting portion 15 and the bottom surface 16b of the second connecting portion 16. The third connecting portion 17 may be in contact with a pad 27 on the top surface of the module substrate 20. The first and second connecting portions 15 and 16 may be electrically connected to the first and second electronic devices 31 and 32, respectively. In the present example embodiments, because the bottom surface 11b of the substrate 11 has a plurality of staircase portions, the semiconductor package 10 may overlap a plurality of the electronic devices 31 and 32, when viewed in a plan view. This makes it possible to reduce a size of the semiconductor module 6. By adjusting positions and dispositions of the staircase portions and the first to third regions R1, R2, and R3 provided on the bottom surface 11b of the substrate 11, it is possible to control the height differences between the bottom surfaces 15b, 16b, and 17b and dispositions of the connecting portions 15, 16, and 17. Accordingly, it is possible to reduce limitation caused by the presence of the electronic device 30, when the semiconductor package 10 is disposed on the module substrate 20.

A semiconductor package according to an example embodiment of the inventive concepts will be described below.

Figure 6A:
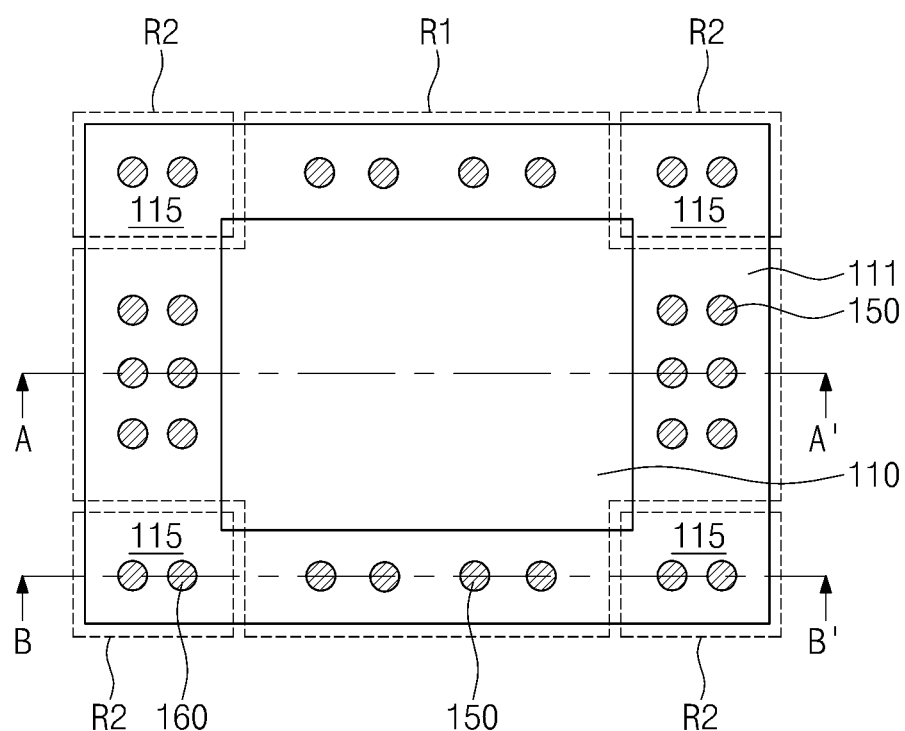
FIG. 6A is a plan view illustrating a semiconductor package according to an example embodiment of the inventive concepts.
Figure 6B:
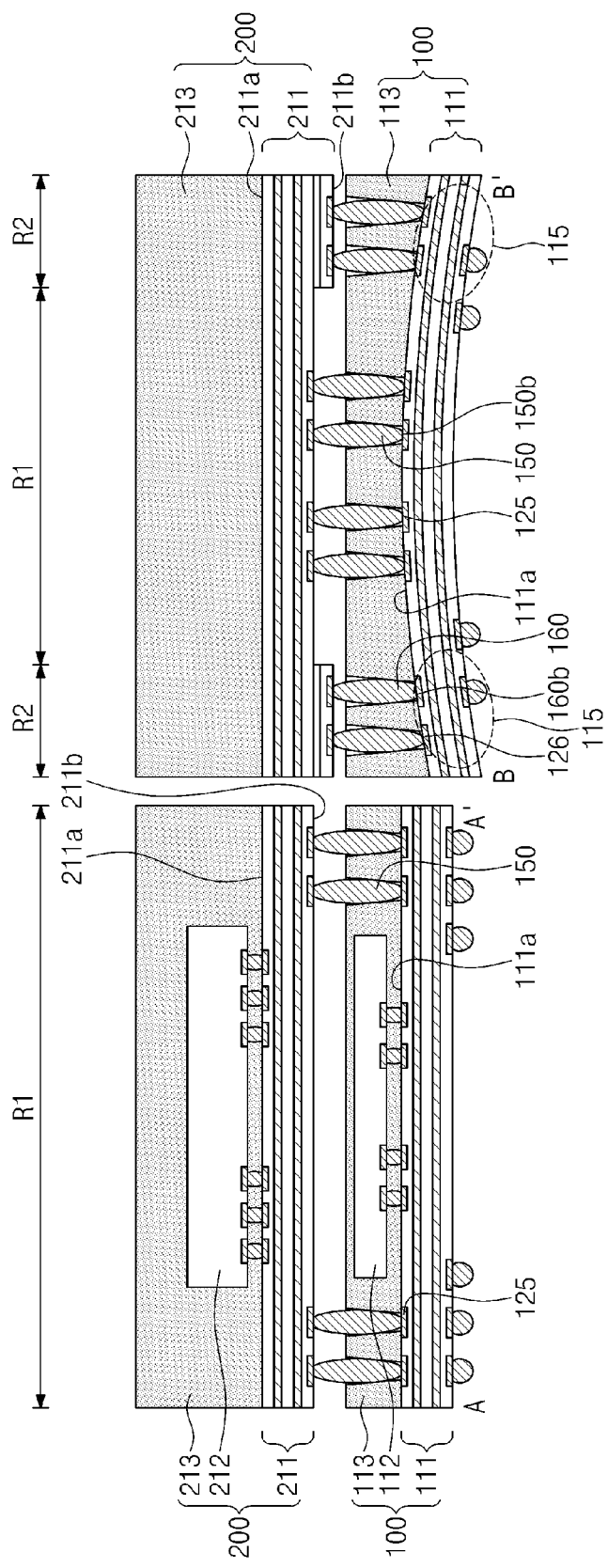
FIG. 6B is a sectional view taken along lines A-A' and B-B' of FIG. 6A.

FIG. 6A is a plan view illustrating a semiconductor package according to an example embodiment of the inventive concepts, and FIG. 6B is a sectional view taken along lines A-A' and B-B' of FIG. 6A. For concise description, previously described elements may be identified by similar or identical reference numbers without repeating overlapping descriptions thereof.

Referring to FIGS. 6A and 6B, a semiconductor package 10a may include a lower package 100 and an upper package 200. The lower package 100 may include a lower substrate 111, a lower semiconductor chip 112, and a lower mold layer 113. The lower substrate 111 may be a printed circuit board (PCB). A warpage may occur in the lower substrate 111. The lower substrate 111 may have an upwardly convex section. For example, the lower substrate 111 may have an edge that bend away from the upper package 200. Accordingly, the curved portion 115 may be farther from the upper package 200 than other portion of the lower substrate 111. The lower semiconductor chip 112 may be mounted on a top surface 111a of the lower substrate 111. The lower mold layer 113 may be provided on the top surface 111a of the lower substrate 111 to cover the lower semiconductor chip 112. The curved portion 115 may correspond to one of edges of the lower substrate 111, as shown in FIG. 6A, but the position of the curved portion 115 may be variously changed.

The upper package 200 may include an upper substrate 211, an upper semiconductor chip 212, and an upper mold layer 213. The upper package 200 may have substantially the same or similar configuration as the semiconductor package 10 previously described with reference to FIGS. 1A and 1B. For example, the upper substrate 211, the upper semiconductor chip 212, and the upper mold layer 213 may correspond to the substrate 11, the semiconductor chip 12, and the mold layer 13, respectively, of FIGS. 1A and 1B. For example, the upper substrate 211 may be a printed circuit board. A top surface 211a of the upper substrate 211 may have a flat shape, and a bottom surface 211b may have a staircase shape. The bottom surface 211b may have the first region R1 and the second region R2 positioned at a lower level than the first region R1. The second region R2 may have a shape protruding toward the lower substrate 111, compared with the first region R1. When viewed in a plan view, as shown in FIG. 6A, the second region R2 may overlap the curved portion 115 of the lower substrate 111. The upper semiconductor chip 212 may be mounted on the top surface 211a of the upper substrate 211. The upper mold layer 213 may be provided on the top surface 211a of the upper substrate 211 to cover the upper semiconductor chip 212.

A first connecting portion 150 and a second connecting portion 160 (collectively, "connecting portions") may be interposed between the lower substrate 111 and the upper substrate 211 to electrically connect the upper package 200 to the lower package 100. The connecting portions 150 and 160 may include a conductive material. The first and second connecting portions 150 and 160 may be provided on the first and second regions R1 and R2, respectively, of the bottom surface 211b of the upper substrate 211. The second connecting portion 160 may have substantially the same volume and height as the first connecting portion 150. The second region R2 of the bottom surface 211b may be positioned at a lower level than the first region R1 of the bottom surface 211b, and thus a bottom surface 160b of the second connecting portion 160 may be positioned at a lower level than a bottom surface 150b of the first connecting portion 150. The bottom surface 160b of the second connecting portion 160 may be in contact with a second pad 126 on the curved portion 115, and the first connecting portion 150 may be in contact with a first pad 125 on the core portion of the lower substrate 111. Accordingly, the upper package 200 can be mounted reliably on the lower substrate 111. A difference in height between the bottom surfaces 150b and 160b of the connecting portions 150 and 160 may be substantially equal to that a height difference formed on the bottom surface 211b of the upper substrate 211. Dispositions and height differences of the first and second regions R1 and R2 may be changed in consideration of a position and a curvature of the curved portion 115 of the lower substrate 111.

FIGS. 7A through 7D are cross-sectional views illustrating a method of fabricating a semiconductor package according to an example embodiment of the inventive concepts. FIGS. 7A through 7D are cross-sectional views taken along line A-A' of FIG. 6A. For concise description, previously described elements may be identified by similar or identical reference numbers without repeating overlapping descriptions thereof.

Referring to FIG. 7A, the upper package 200 may be provided. The upper package 200 may be formed using the same method as that described with reference to FIGS. 2A through 2F. The upper substrate 211, the upper semiconductor chip 212, and the upper mold layer 213 may be configured to have the same or similar features as those of the previous example embodiments of FIGS. 6A and 6B. For example, the second region R2 of the bottom surface 211b of the upper substrate 211 may correspond to an edge of the upper package 200. A second upper connecting portion 162 may be provided on the second region R2, and a first upper connecting portion 152 may be provided on the first region R1. The first and second upper connecting portions 152 and 162 may be provided to have substantially the same volume and height. A bottom surface 162b of the second upper connecting portion 162 may be positioned at a lower level than a bottom surface 152b of the first upper connecting portion 152.

Referring to FIG. 7B, the lower package 100 may be provided. The lower package 100 may include the lower substrate 111, the lower semiconductor chip 112, and the lower mold layer 113. The lower package 100 may be configured to have the same or similar features as those of FIGS. 6A and 6B. As an example, the lower semiconductor chip 112 and the lower mold layer 113 may be formed on the lower substrate 111. Openings 113o may be formed in the lower mold layer 113. For example, the openings 113o may be formed to expose the first pad 125 and the second pad 126 (collectively, "pads"). First and second lower connecting portions 151 and 161 may be formed in the openings 113o and be in contact with the pads 125 and 126 on the lower substrate 111. In certain example embodiments, the formation of the lower mold layer 113 may be omitted.

The lower substrate 111 may include the curved portion 115. The curved portion 115 may correspond to the edge of the lower substrate 111, but example embodiments of the inventive concepts may not be limited thereto. The first and second lower connecting portions 151 and 161 may be formed on the top surface 111a of the lower substrate 111. The second lower connecting portion 161 may be provided on the curved portion 115, and the first lower connecting portion 151 may be disposed spaced apart from the curved portion 115 in a horizontal direction. The first and second lower connecting portions 151 and 161 may have the same volume and height as each other. The second lower connecting portion 161 may have a top surface 161a that is positioned at a lower level than a top surface 151a of the first lower connecting portion 151.

Figure 7C:
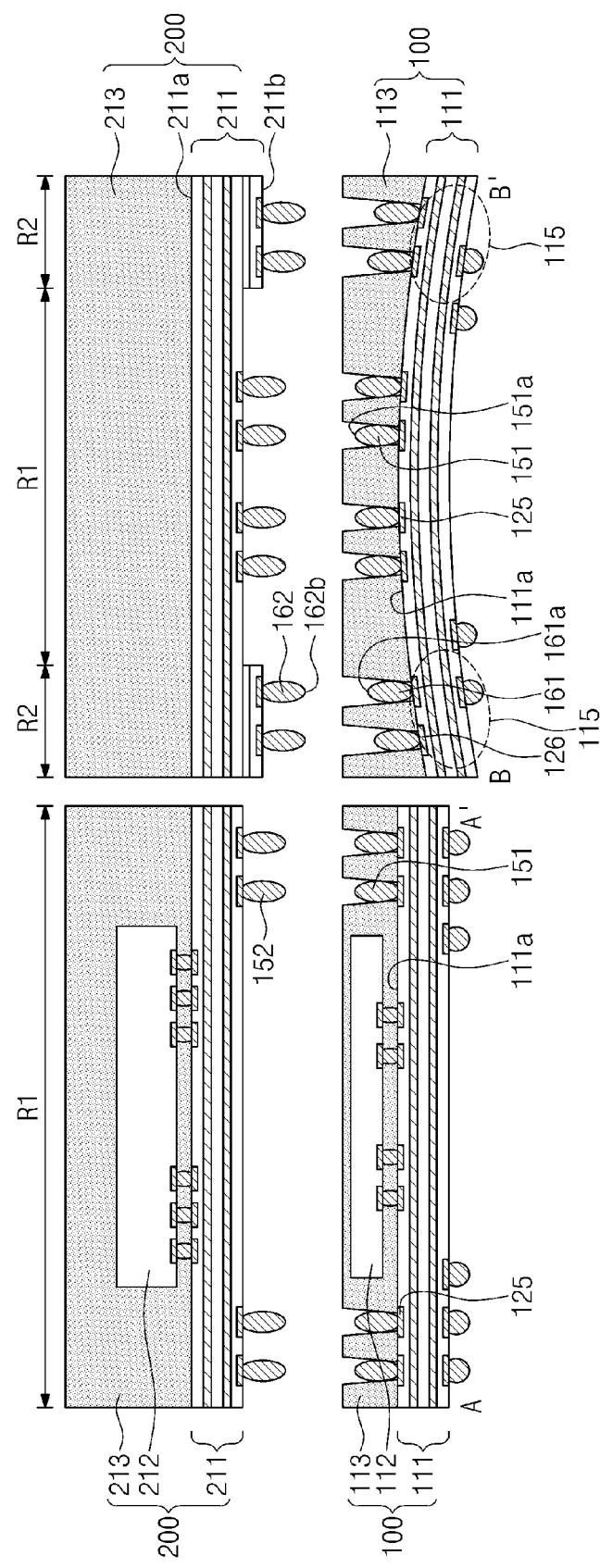
Figure 7D:
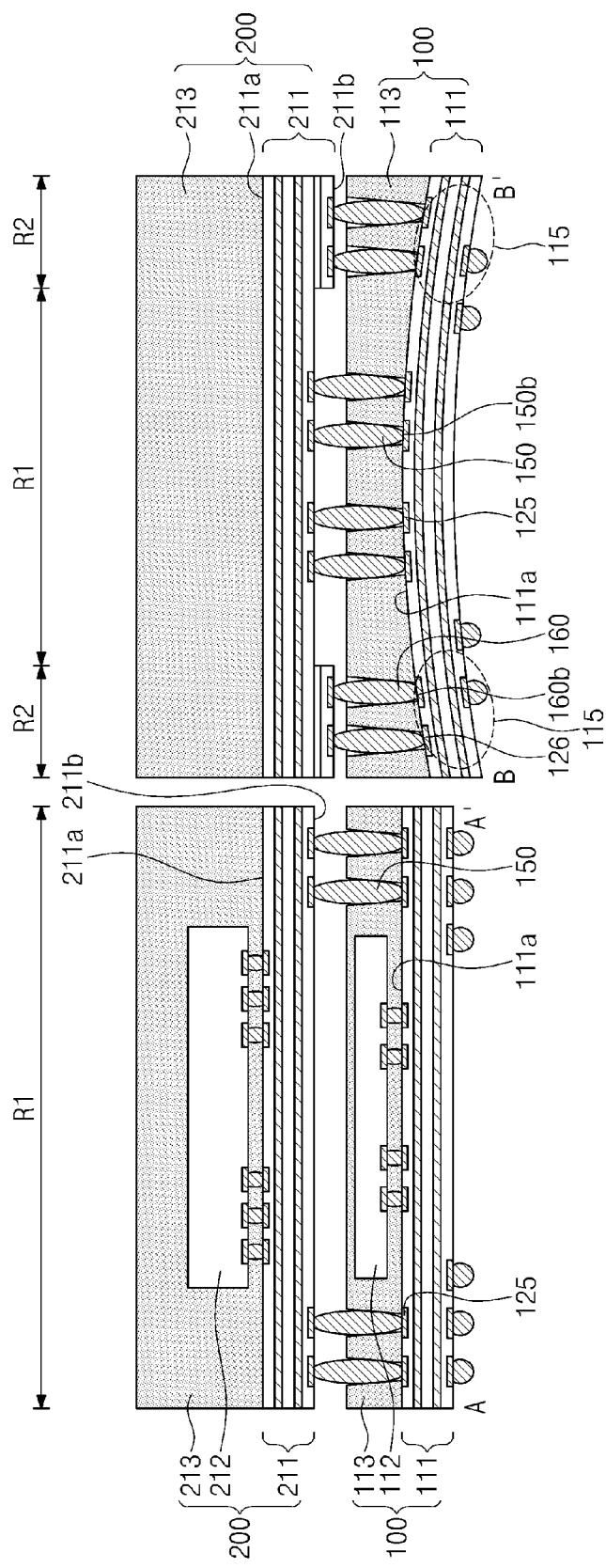

Referring to FIGS. 7C and 7D, the upper package 200 may be provided on the lower package 100. The first and second upper connecting portions 152 and 162 may be provided on the first and second lower connecting portions 151 and 161, respectively.

Due to the presence of the curved portion 115, the top surface 161a of the second lower connecting portion 161 may be positioned at a lower level than the top surface 151a of the first lower connecting portion 151. In the case where the bottom surface 152b of the first upper connecting portion 152 is positioned at the same level as a bottom surface 162b of the second upper connecting portion 162, the first connecting portion 150 may be formed normally, whereas the second connecting portion 160 may be formed abnormally. For example, the second lower connecting portion 161 may not be connected to the second upper connecting portion 162. By contrast, according to the present example embodiment, the bottom surface 162b of the second upper connecting portion 162 may be positioned at a lower level than the bottom surface 152b of the first upper connecting portion 152. Accordingly, the first upper connecting portion 152 and the first lower connecting portion 151 can be reliably connected to each other to form the first connecting portion 150. Similarly, the second upper connecting portion 162 and the second lower connecting portion 161 can be reliably connected to each other to form the second connecting portion 160. Accordingly, the upper package 200 may be mounted reliably on the lower package 100 by the first and second connecting portions 150 and 160.

A semiconductor package according to another example embodiment of the inventive concepts will be described below.

Figure 8A:
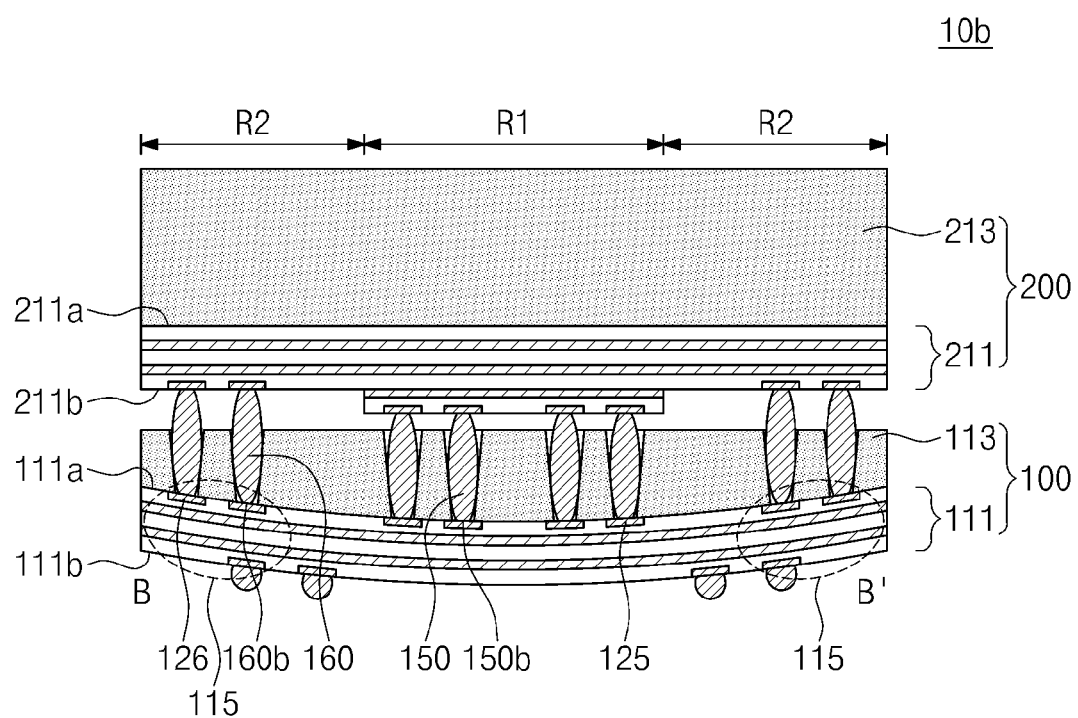
FIG. 8A is a cross-sectional view illustrating a semiconductor package according to another example embodiment of the inventive concepts.
Figure 8B:
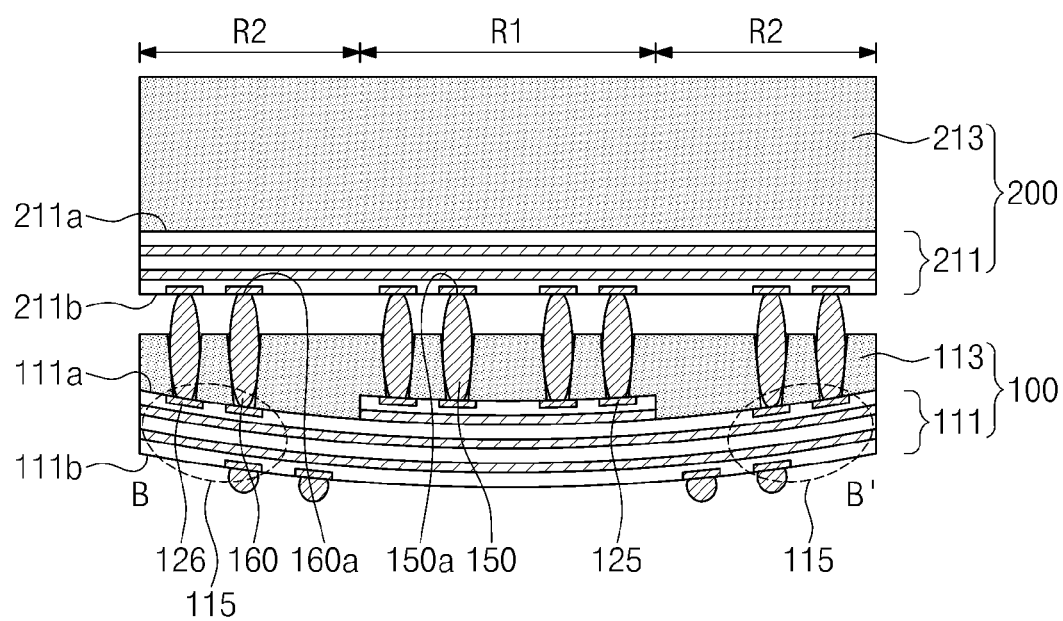
FIG. 8B is a cross-sectional view illustrating a semiconductor package according to still another example embodiment of the inventive concepts.

FIGS. 8A and 8B are cross-sectional views taken along line B-B' of FIG. 6A to illustrate semiconductor packages, according to other example embodiments of the inventive concepts. For concise description, previously described elements may be identified by similar or identical reference numbers without repeating overlapping descriptions thereof.

Referring to FIGS. 8A and 8B in conjunction with FIG. 6A, each of semiconductor packages 10b and 10c may include the lower package 100 and the upper package 200. The upper package 200 may include the upper substrate 211, the upper semiconductor chip (not shown), and the upper mold layer 213. The upper semiconductor chip (not shown) and the upper mold layer 213 may have substantially the same or similar configuration as those of the previous example embodiments described with reference to FIGS. 6A and 6B. The connecting portions 150 and 160 may be interposed between the lower substrate 111 and the upper substrate 211 to electrically connect the upper package 200 to the lower package 100. The connecting portions 150 and 160 may have the same volume and height, but example embodiments of the inventive concepts may not be limited thereto.

A warpage may occur in the lower substrate 111. The curved portion 115 of the lower substrate 111 may have a downwardly convex shape. The curved portion 115 may bend toward the upper substrate 211 and may correspond to the edge of the lower substrate 111. In the case where the lower substrate 111 has a curved shape, the bottom surface 211b of the upper substrate 211 may be provided to have a height difference, as shown in FIG. 8A, or the top surface 111a of the lower substrate 111 may be provided to have a staircase shape, as shown in FIG. 8B. As another example, both the bottom surface 211b and the top surface 111a may be provided to have a staircase shape. Hereinafter, height differences of the upper and lower substrates 211 and 111 and the connecting portions 150 and 160 will be described in more detail.

Referring to FIG. 8A, the top surface 211a of the upper substrate 211 may have a flat shape, and the bottom surface 211b may have a staircase shape. The bottom surface 211b may have the first region R1 and the first region R1 positioned at a lower level than the second region R2. The first region R1 may have a shape protruding toward the lower substrate 111, compared with the second region R2. The second region R2 may overlap the curved portion 115, and the first region R1 may be spaced apart from the curved portion 115 in the horizontal direction.

The first and second connecting portions 150 and 160 may be provided on the first and second regions R1 and R2, respectively, of the bottom surface 211b of the upper substrate 211. The second connecting portion 160 may be overlapped with the curved portion 115 provided at the edge region of the lower substrate 111. The second connecting portion 160 may have the same volume and height as the first connecting portion 150. Because the level of the bottom surface 211b is lower on the first region R1 than on the second region R2, the bottom surface 150b of the first connecting portion 150 may be positioned at a lower level than the bottom surface 160b of the second connecting portion 160. The bottom surface 160b of the second connecting portion 160 may be in contact with the second pad 126 on the curved portion 115, and the first connecting portion 150 may be in contact with the first pad 125 on the core portion of the lower substrate 111. Accordingly, the upper package 200 can be reliably mounted on the lower substrate 111 having a curved shape. A difference in height between the bottom surfaces 150b and 160b of the connecting portions 150 and 160 may be substantially equal to a height difference formed on the bottom surface 211b of the upper substrate 211. Dispositions and height differences of the first and second regions R1 and R2 may be changed in consideration of a position and a curvature of the curved portion 115 of the lower substrate 111.

As shown in FIG. 8B, the top surface 111a of the lower substrate 111 may have the first region R1 and the second region R2. Here, the first region R1 may protrude toward the bottom surface 211b of the upper substrate 211. The second region R2 may be provided at a position corresponding to the curved portion 115 of the lower substrate 111, and the first region R1 may be laterally spaced apart from the curved portion 115. Accordingly, the first region R1 of the top surface 111a of the lower substrate 111 may protrude from the second region R2 thereof.

The first and second connecting portions 150 and 160 may be provided respectively on the first and second regions R1 and R2 of the bottom surface 211b of the upper substrate 211. The first connecting portion 150 may be spaced apart from the curved portion 115 positioned at the edge region of the lower substrate 111. The first connecting portion 150 may have substantially the same volume and height as the second connecting portion 160.

In the case where the first region R1 does not have a protruded shape, a top surface 150a of the first connecting portion 150 may be positioned at a level that is lower than a top surface 160a of the second connecting portion 160. Accordingly, the second connecting portion 160 may be in contact with the upper substrate 211, and the first connecting portion 150 may not be in contact with the upper substrate 211. In the present example embodiments, although the curved portion 115 is curved toward the upper substrate 211, due to the protruding shape of the first region R1 of the top surface 111a of the lower substrate 111, the top surface 160a of the second connecting portion 160 may be positioned at substantially the same or similar level as the top surface 150a of the first connecting portion 150. The first and second connecting portions 150 and 160 may be in contact with the upper substrate 211. The first and second regions R1 and R2 of a bottom surface 111b of the lower substrate 111 may be formed to have a height difference that is associated with a curvature of the curved portion 115 of the lower substrate 111.

Figure 9A:
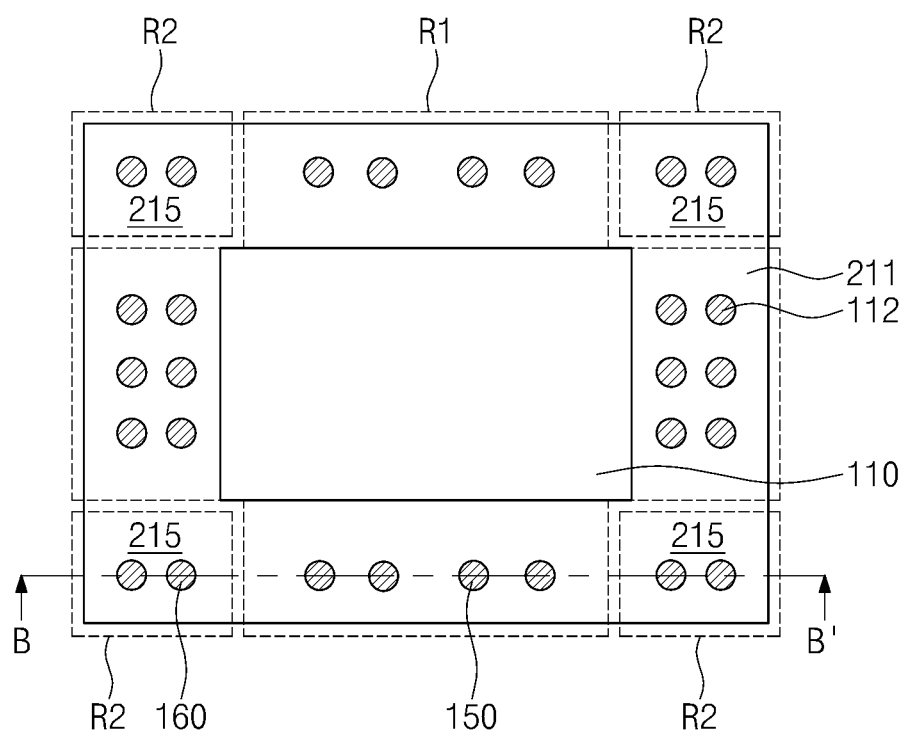
FIG. 9A is a plan view illustrating a semiconductor package according to even another example embodiment of the inventive concepts.
Figure 9B:
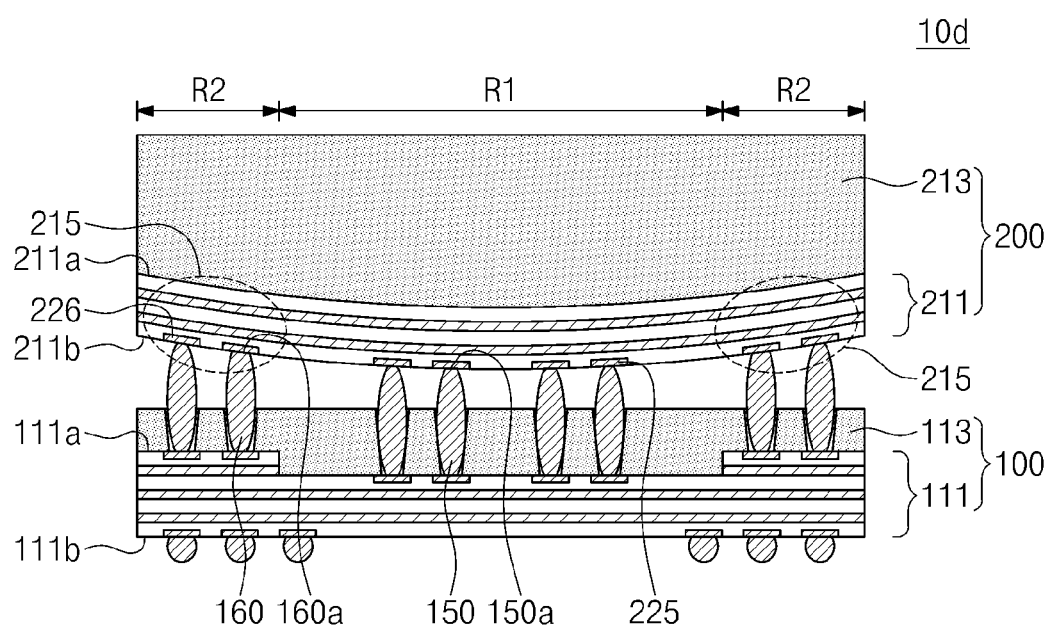
FIG. 9B is a cross-sectional view taken along a line IX-IX' of FIG. 9A.
Figure 9C:
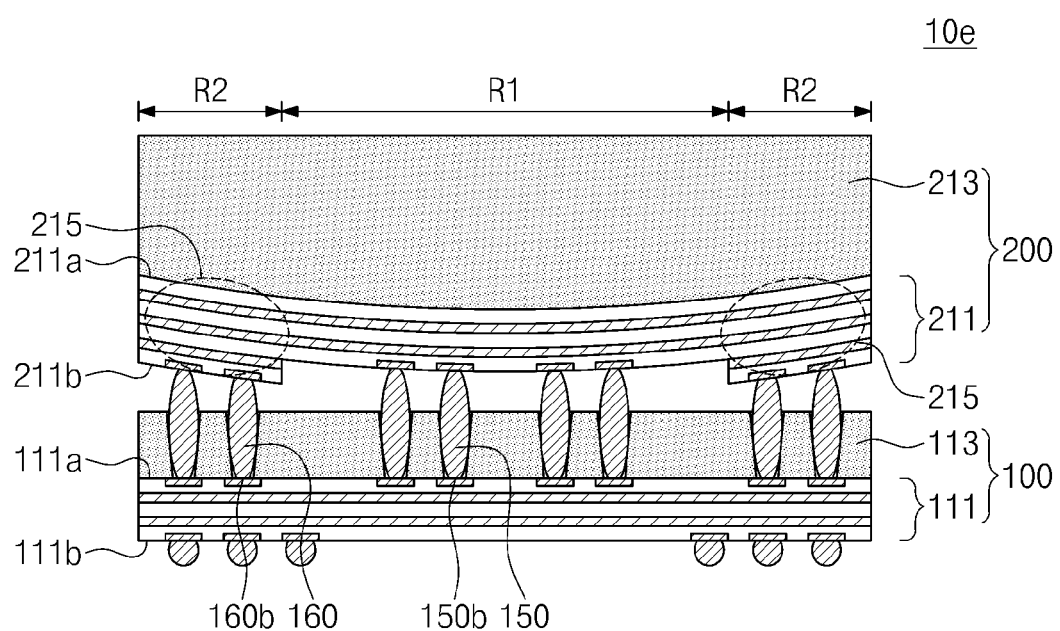
FIG. 9C is a cross-sectional view illustrating a semiconductor package according to yet another example embodiment of the inventive concepts.

FIG. 9A is a plan view illustrating a semiconductor package according to even another example embodiment of the inventive concepts. FIG. 9B is a cross-sectional view taken along a line IX-IX' of FIG. 9A. FIG. 9C is a cross-sectional view illustrating a semiconductor package according to yet another example embodiment of the inventive concepts. For concise description, previously described elements may be identified by similar or identical reference numbers without repeating overlapping descriptions thereof.

Referring to FIGS. 9A through 9C, the semiconductor package 10 may include the lower package 100 and the upper package 200. The lower package 100 may include the lower substrate 111, the lower semiconductor chip 112, and the lower mold layer 113. The connecting portions 150 and 160 may be interposed between the lower substrate 111 and the upper substrate 211 to electrically connect the upper package 200 to the lower package 100.

The upper package 200 may include the upper substrate 211, the upper semiconductor chip (not shown), and the upper mold layer 213. A warpage may occur in the upper substrate 211. A curved portion 215 of the upper substrate 211 may have a downwardly convex shape and correspond to an edge of the upper substrate 211. The curved portion 215 may be a portion curved away from the lower substrate 111. In this case, as shown in FIG. 8A, the top surface 111a of the lower substrate 111 may have a staircase shape, or as shown in FIG. 8B, the bottom surface 211*b* of the upper substrate 211 may have a staircase shape. As another example, both of the top surface 111*a* of the lower substrate 111 and the bottom surface 211*b* of the upper substrate 211 may have a staircase shape. Hereinafter, height differences in the top surfaces 111*a*, in the bottom surface 211*b*, and between the connecting portions 150 and 160 will be described in more detail.

As shown in FIG. 9B, the bottom surface 111*b* of the lower substrate 111 may be flat, and the top surface 111*a* may have a staircase shape. The top surface 111*a* may have the first region R1 and the second region R2 positioned at a higher level than the first region R1. The second region R2 may correspond to the bottom surface 211*b* of the curved portion 215 and may protrude toward the upper substrate 211. As shown in FIG. 9A, the second region R2 may overlap the curved portion 215, when viewed in a plan view.

Referring back to FIG. 9B, the first connecting portion 150 may be provided on the first region R1 of the top surface 111*a* of the lower substrate 111, and the second connecting portion 160 may be provided on the second region R2 of the top surface 111*a*. The second region R2 of the top surface 111*a* may be positioned at a higher level than the first region R1 of the top surface 111*a*, and thus the top surface 160*a* of the second connecting portion 160 may be positioned at a higher level than the top surface 150*a* of the first connecting portion 150. The top surface 160*a* of the second connecting portion 160 may be in contact with a second pad 226 on the curved portion 215, and the first connecting portion 150 may be in contact with a first pad 225 on the core portion of the upper substrate 211. Accordingly, the upper substrate 211 with the curved portion 215 may be reliably mounted on the lower substrate 111 by the connecting portions 150 and 160. Dispositions and height differences of the first and second regions R1 and R2 may be changed in consideration of a position and a curvature of the curved portion 215 of the upper substrate 211.

Referring to FIG. 9C, the bottom surface 211*b* of the upper substrate 211 may have a staircase shape. For example, the bottom surface 211*b* may have the first region R1 and the second region R2 positioned at a lower level than the first region R1. The second region R2 may have a shape protruding toward the lower substrate 111, compared with the first region R1. The second region R2 may correspond to the bottom surface 211*b* of the curved portion 215 of the upper substrate 211.

The first connecting portion 150 may be provided on the first region R1 of the bottom surface 211*b* of the upper substrate 211, and the second connecting portion 160 may be provided on the second region R2. Although the curved portion 215 is curved away from the lower substrate 111, due to the protruding shape of the second region R2 of the bottom surface 211*b*, the bottom surface 160*b* of the second connecting portion 160 can be positioned at the same or similar level as the bottom surface 150*b* of the first connecting portion 150. Although the upper substrate 211 has the curved portion 215, the upper package 200 can be reliably mounted on the lower substrate 111 by the connecting portions 150 and 160.

Unlike the previous example embodiments described with reference to FIGS. 9A through 9C, the curved portion 215 of the upper substrate 211 may bend toward the lower substrate 111. In this case, the bottom surface 211*b* of the upper substrate 211 and/or the top surface 111*a* of the lower substrate 111 may be formed to have a height difference such that the connecting portions 150 and 160 reliably connect the upper package 200 to the lower package 100. A height difference of the bottom surface 211*b* of the upper substrate 211 and/or the top surface 111*a* of the lower substrate 111 may be adjusted in consideration of a position and a curvature of the curved portion 215 of the upper substrate 211.

[Applications]

Figure 10:
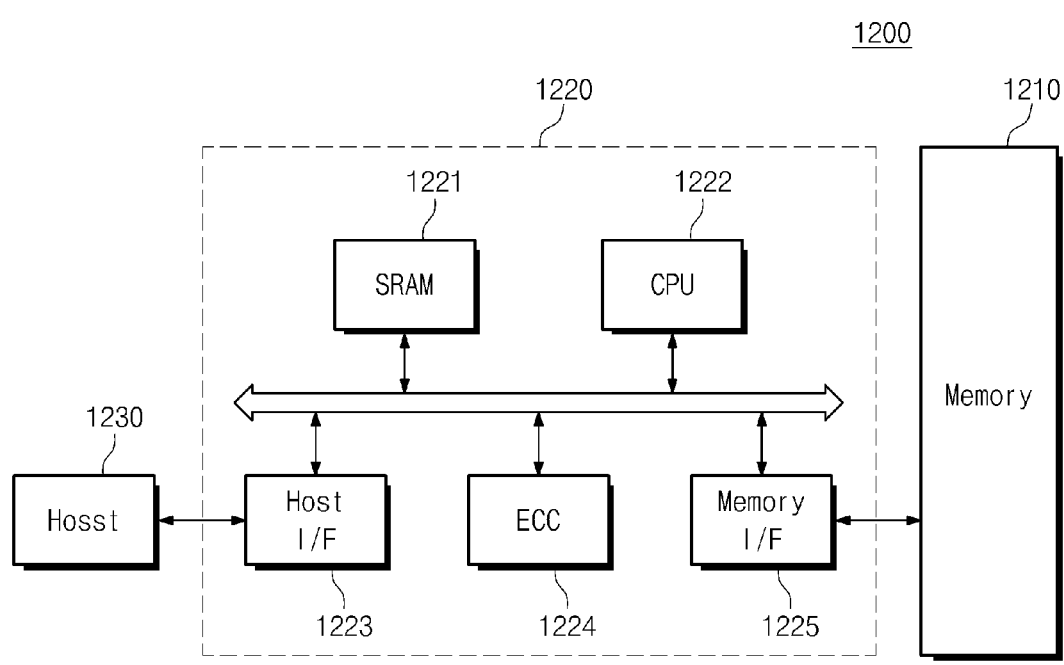
FIG. 10 is a block diagram illustrating a memory card including the semiconductor packages according to an example embodiment of the inventive concepts.
Figure 11:
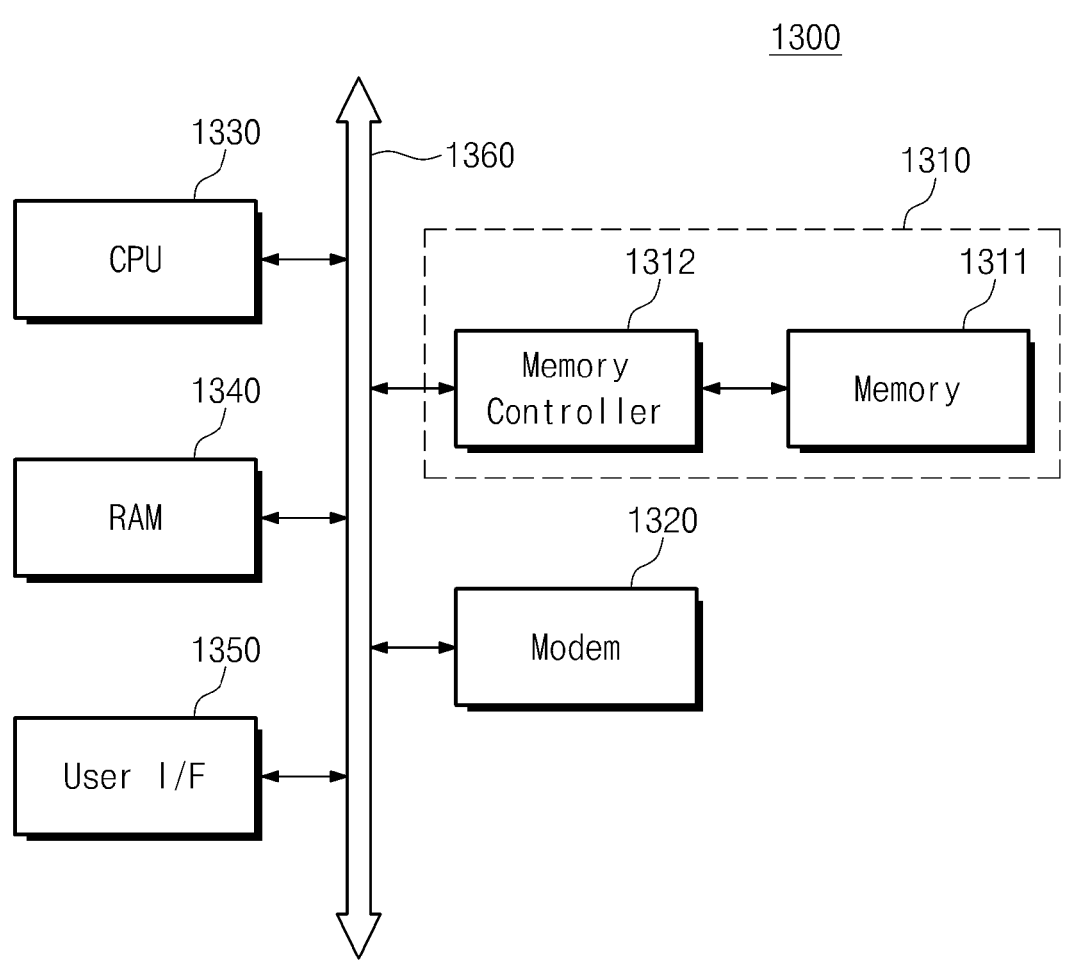
FIG. 11 is a block diagram illustrating an information processing system including the semiconductor packages according to an example embodiment of the inventive concepts.

FIG. 10 is a block diagram illustrating a memory card including the semiconductor packages according to an example embodiment of the inventive concepts. FIG. 11 is a block diagram illustrating an information processing system including the semiconductor packages according to an example embodiment of the inventive concepts.

Referring to FIG. 10, a memory card 1200 may include a host 1230, a memory device 1210, and a memory controller 1220 configured to control data exchanges therebetween. A static random access memory (SRAM) 1221 may be used as an operating memory of a processing unit 1222. A host interface 1223 may include a data exchange protocol of a host connected to a memory card 1200. An error correction block 1224 may be configured to detect and correct errors included in data read from a memory device 1210. A memory interface 1225 may be configured to interface with the memory device 1210. The processing unit 1222 may perform general control operations for data exchange of the memory controller 1220. The memory device 1210 may include at least one of the semiconductor packages according to example embodiments of the inventive concepts.

Referring to FIG. 11, an information processing system 1300 may be realized using a memory system 1310 including at least one of the semiconductor packages according to example embodiments of the inventive concepts. For instance, the information processing system 1300 may be a mobile device and/or a computer. In example embodiments, the information processing system 1300 may further include a modem 1320, a central processing unit (CPU) 1330, a random access memory (RAM) 1340, and a user interface 1350, which are electrically connected to the memory system 1310 via a system bus 1360. The memory system 1310 may include a memory device 1311 and a memory controller 1312, and in some example embodiments, the memory system 1310 may be configured substantially identical to the memory card 1200 described with respect to FIG. 8. Data processed by the CPU 1330 and/or input from the outside may be stored in the memory system 1310. In certain example embodiments, the information processing system 1300 may further include or be, for example, an application chipset, a camera image sensor, a camera image signal processor (ISP), an input/output device, or the like.

According to example embodiments of the inventive concepts, a surface of a semiconductor package may have a staircase shape. For example, a second region of the surface may be positioned at a lower level than a first region thereof. Accordingly, a second connecting portion on the second region may be positioned at a lower level than a first connecting portion on the first region. As a result, a semiconductor package can be reliably mounted on a curved module substrate. As another example, an electronic device may be interposed between the semiconductor package and the module substrate, and this makes it possible to reduce a size of a semiconductor module.

One of lower and upper substrates of a semiconductor package may be provided to have a curved shape. Here, at least one of a top surface of the lower substrate and a bottom surface of the upper substrate may be provided to have a staircase shape. Accordingly, an upper package can be reliably mounted on a lower package by first and second connecting portions. As a result, a semiconductor package can be fabricated to have improved reliability.

While a few example embodiments of the inventive concepts have been particularly shown and described, it will be understood by one of ordinary skill in the art that variations in form and detail may be made therein without departing from the spirit and scope of the attached claims.

What is claimed is:

1. A semiconductor module, comprising:
a module substrate having a convex-curved section; and
a semiconductor package on the module substrate, the semiconductor package including,
  a substrate including a top surface and a bottom surface, the top surface being flat and the bottom surface including a first region and a second region at a lower level than the first region, the first region being at a central region of the substrate and corresponding to an apex portion of the convex-curved section,
  a semiconductor chip on the top surface of the substrate, and
  connecting portions on the bottom surface of the substrate and electrically connected to the module substrate, the connecting portions including first connecting portions on the first region and second connecting portions on the second regions, and bottom surfaces of the second connecting portions being lower than bottom surfaces of the first connecting portions,
  wherein when viewed in a plan view, the semiconductor chip overlaps the first region of the bottom surface of the substrate, and the semiconductor chip partially overlaps a portion of the second region of the bottom surface of the substrate, and an entire remaining portion of the second region that is not overlapped by the semiconductor chip is flat.

2. The semiconductor module of claim 1, wherein the second connecting portions have a same height as the first connecting portions.

3. The semiconductor module of claim 1, wherein the convex-curved section has a first curved portion protruding toward the semiconductor package and a second curved portion being farther from the semiconductor package than the first curved portion, and
when viewed in a plan view, the second curved portion overlaps the second region of the substrate.

4. The semiconductor module of claim 1, further comprising:
an electronic device between the module substrate and the semiconductor package.

5. The semiconductor module of claim 4, wherein when viewed in a plan view, the electronic device overlaps the first region of the substrate.

6. The semiconductor module of claim 1, wherein the substrate is thicker at the second region than at the first region.

7. A semiconductor module, comprising:
a module substrate having a convex-curved section; and
a semiconductor package on the module substrate, the semiconductor package including,
  a substrate with a top surface with a flat shape and a bottom surface with a protrusion protruding toward the module substrate, the bottom surface including a central region and a peripheral region adjacent to the central region, the protrusion being at the peripheral region of the substrate, the central region corresponding to an apex portion of the convex-curved section,
  a semiconductor chip on the top surface of the substrate,
  a first connecting portion on the bottom surface of the substrate and laterally spaced apart from the protrusion, and
  a second connecting portion on the protrusion of the substrate,
  wherein when viewed in a plan view, the semiconductor chip overlaps the central region of the bottom surface of the substrate, and the semiconductor chip partially overlaps a portion of the peripheral region of the bottom surface of the substrate, and an entire remaining portion of the peripheral region that is not overlapped by the semiconductor chip is flat.

8. The semiconductor module of claim 7, wherein the second connecting portion has a same height as the first connecting portion.

9. The semiconductor module of claim 7, wherein,
the first connecting portion is in contact with a pad on the central region of the module substrate, and
the second connecting portion is in contact with a pad on an edge of the module substrate.

10. The semiconductor module of claim 7, further comprising:
an electronic device between the module substrate and the semiconductor package.

11. The semiconductor module of claim 10, wherein when viewed in a plan view, the electronic device is spaced apart from the protrusion of the substrate.

12. The semiconductor module of claim 10, wherein the first connecting portion is in contact with the electronic device, and the second connecting portion is in contact with the module substrate.

* * * * *